US 10,586,798 B2

(12) United States Patent
Kim et al.

(10) Patent No.: US 10,586,798 B2
(45) Date of Patent: Mar. 10, 2020

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Jin-A Kim, Hwaseong-si (KR);
Yong-Kwan Kim, Yongin-si (KR);
Se-Keun Park, Suwon-si (KR);
Joo-Young Lee, Hwaseong-si (KR);
Cha-Won Koh, Yongin-si (KR);
Yeong-Cheol Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/170,665

(22) Filed: Oct. 25, 2018

(65) Prior Publication Data
US 2019/0206872 A1 Jul. 4, 2019

(30) Foreign Application Priority Data
Jan. 3, 2018 (KR) ........................ 10-2018-0000893

(51) Int. Cl.
*H01L 27/108* (2006.01)
*H01L 21/768* (2006.01)
(Continued)

(52) U.S. Cl.
CPC .. *H01L 27/10855* (2013.01); *H01L 27/10814* (2013.01); *H01L 27/10823* (2013.01);
(Continued)

(58) Field of Classification Search
CPC ......... H01L 27/10855; H01L 27/10823; H01L 27/10814; H01L 27/10885; H01L 27/10888
See application file for complete search history.

(56) References Cited

U.S. PATENT DOCUMENTS 8,558,298 B2   10/2013   Shinhara
9,620,451 B2   4/2017    Hwang et al.
(Continued)

FOREIGN PATENT DOCUMENTS

JP    2015-53447 A    3/2015
KR    10-0900137 B1   6/2009
(Continued)

*Primary Examiner* — Douglas M Menz
(74) *Attorney, Agent, or Firm* — Sughrue Mion, PLLC

(57) ABSTRACT

A semiconductor device and methods of manufacturing the same are provided. The semiconductor device includes a substrate, word lines, a doped junction, bit line structures, and buried contacts. The substrate has active regions. The word lines extend across the active regions. The doped junction has impurities and is arranged at the active regions, and includes first junctions and second junctions, each first junction arranged at a central portion of one of the active regions and each second junction arranged at an end portion of another one of the active regions, a buried semiconductor layer being included in each second junction. The bit line structures contact with a respective one of the first junctions. The buried contacts are arranged in a matrix shape, each contacting with a respective one of the second junctions and the included buried semiconductor layer and simultaneously contacting with a charge storage for storing data.

20 Claims, 31 Drawing Sheets

(51) Int. Cl.
   *H01L 21/3065*    (2006.01)
   *H01L 21/285*     (2006.01)

(52) U.S. Cl.
   CPC .. *H01L 27/10885* (2013.01); *H01L 27/10888*
         (2013.01); *H01L 21/28525* (2013.01); *H01L*
         *21/3065* (2013.01); *H01L 21/76879* (2013.01)

(56) References Cited

U.S. PATENT DOCUMENTS

| | | | |
|---|---|---|---|
| 9,627,253 | B2 | 4/2017 | Kim |
| 9,627,387 | B2 | 4/2017 | Jung et al. |
| 9,640,426 | B2 | 5/2017 | Rho et al. |
| 9,786,558 | B2 | 10/2017 | Kim et al. |

FOREIGN PATENT DOCUMENTS

| | | |
|---|---|---|
| KR | 10-2015-0093471 A | 8/2015 |
| KR | 10-2015-0104337 A | 9/2015 |
| KR | 10-2016-0068067 A | 6/2016 |
| KR | 10-2016-0089095 A | 7/2016 |

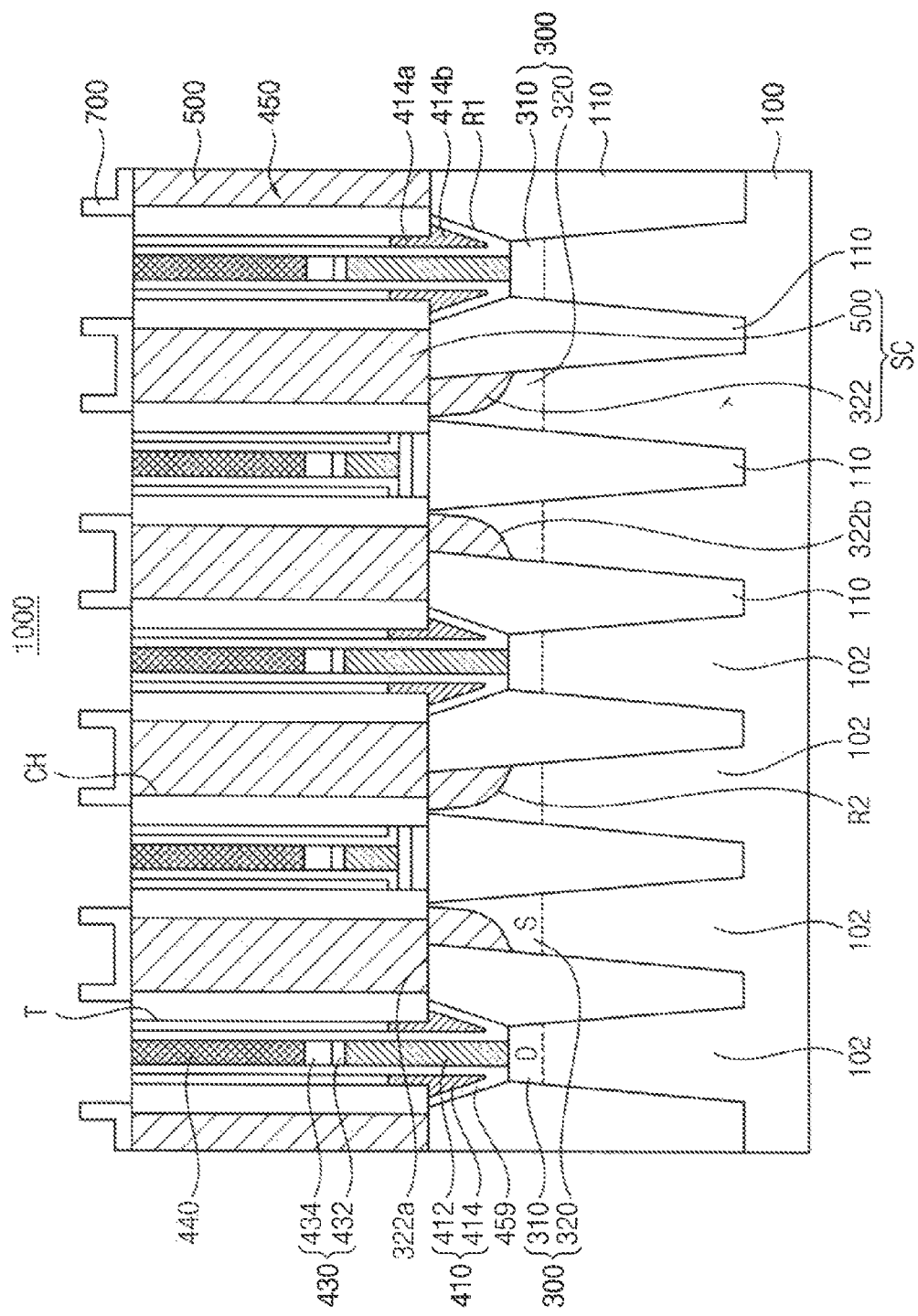

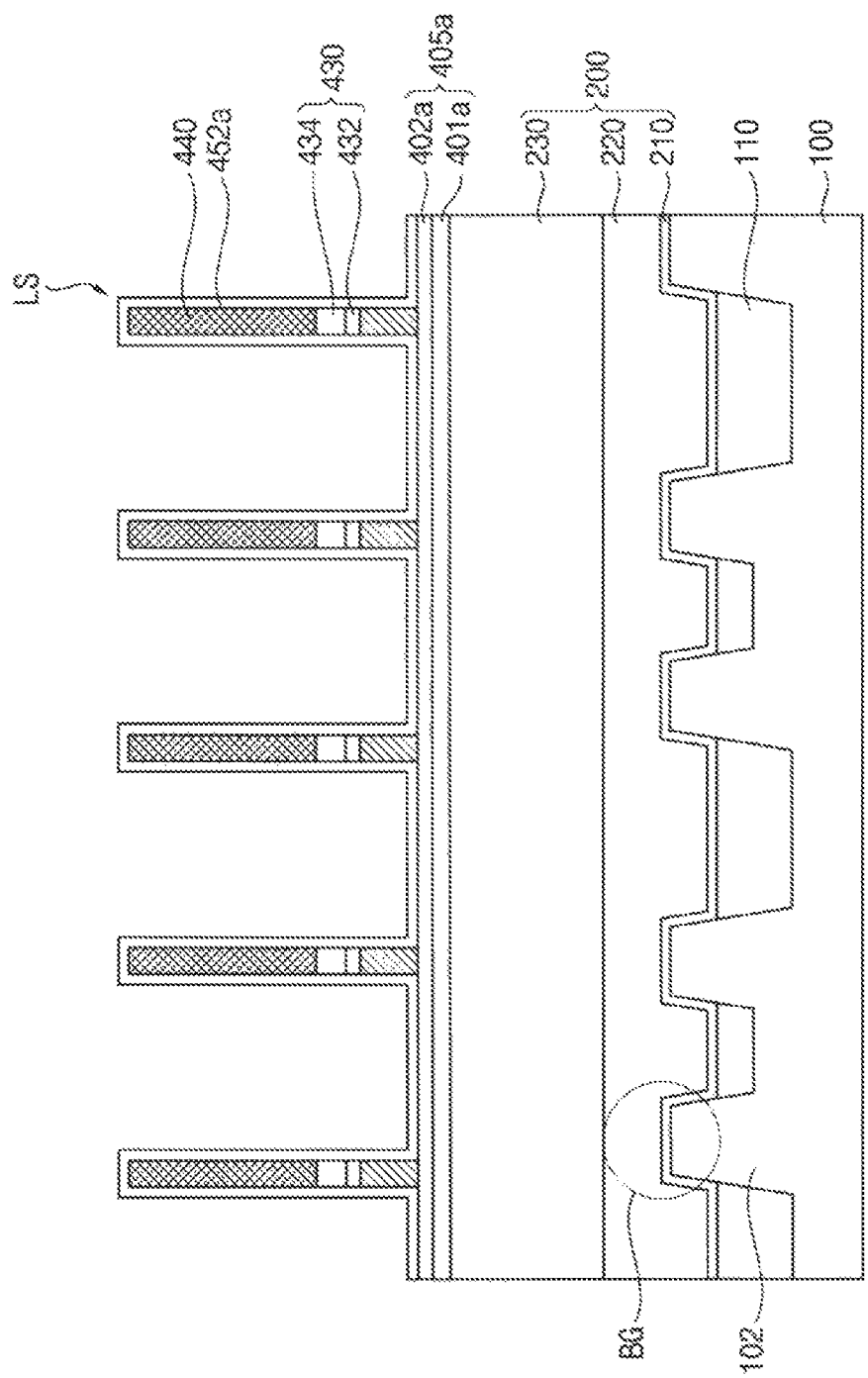

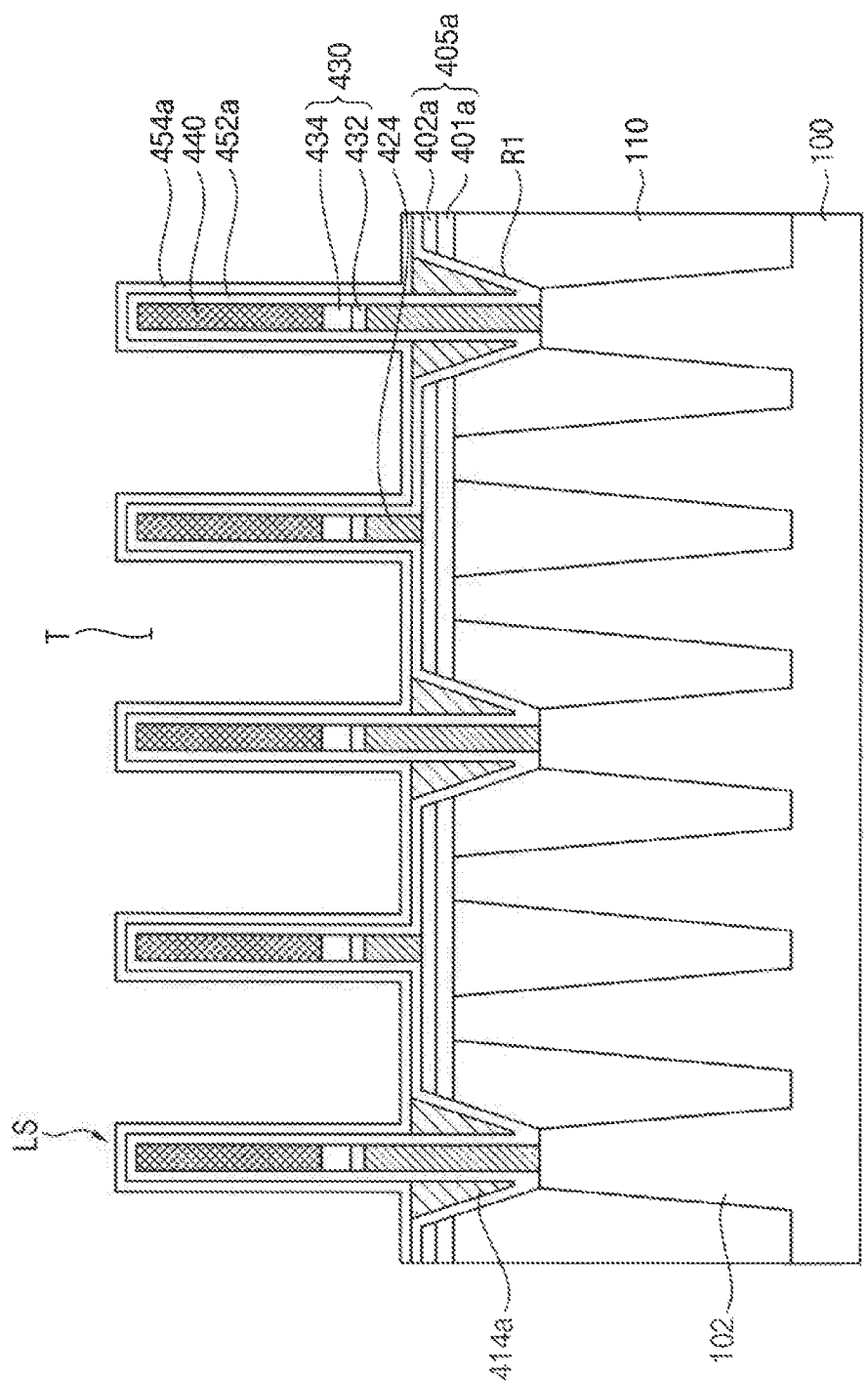

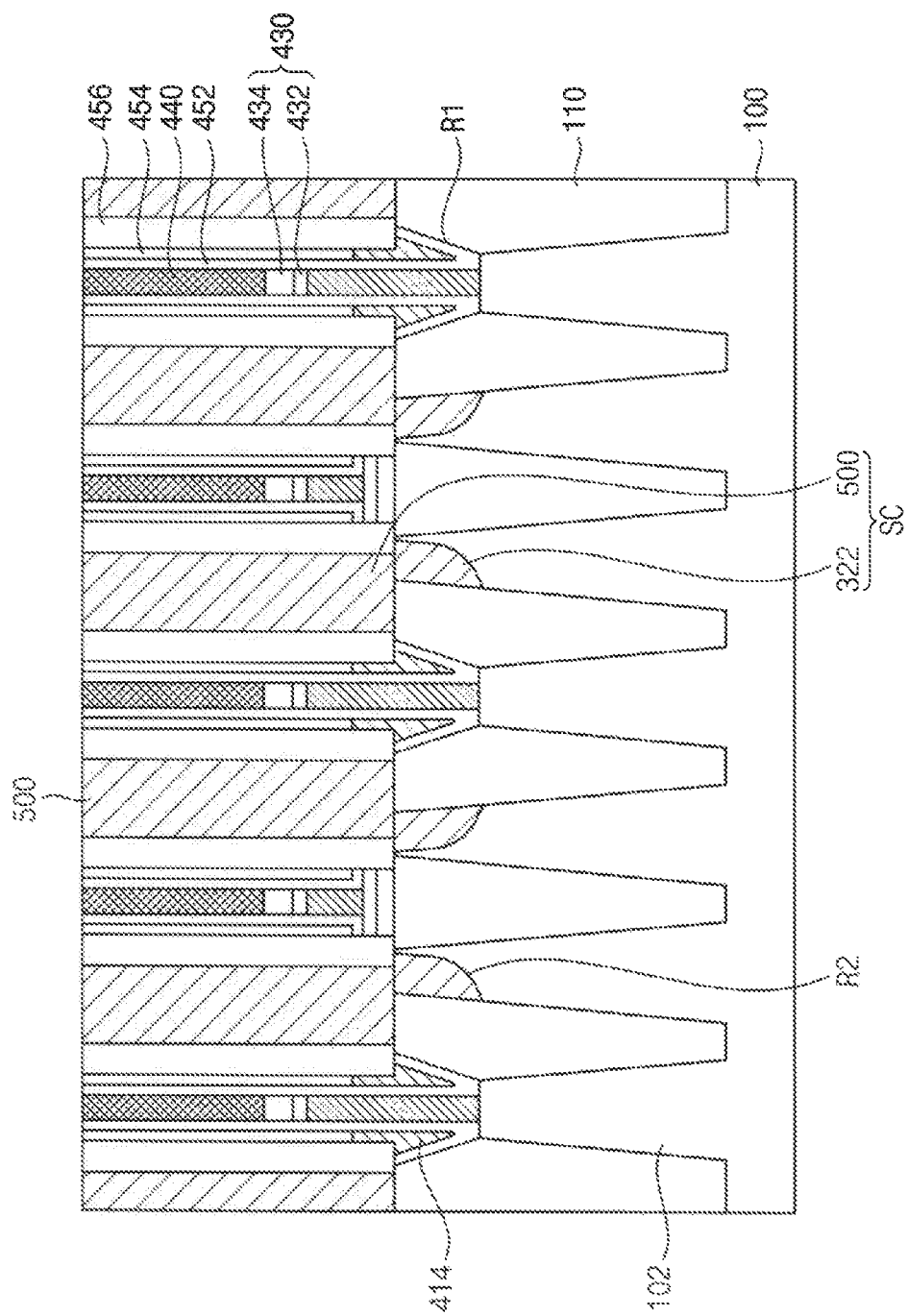

SEMICONDUCTOR DEVICE AND METHOD OF MANUFACTURING THE SAME

CROSS-REFERENCE TO RELATED APPLICATIONS

This application claims priority under 35 U.S.C. § 119 from Korean Patent Application No. 10-2018-0000893 filed on Jan. 3, 2018 in the Korean Intellectual Property Office, the disclosure of which is incorporated by reference herein in its entirety.

BACKGROUND

1. Field

Apparatuses, devices, and articles of manufacture consistent with the present disclosure relate to a semiconductor device and method of manufacturing the same, and more particularly, to a dynamic random access memory (DRAM) device having capacitors and a method of manufacturing the same.

2. Description of the Related Art

As the size of semiconductor devices tends to decrease, the contact area between wirings has been reduced in the semiconductor devices. Thus, a contact process for forming buried contacts between bit lines has become complicated and difficult to implement in DRAM devices.

Particularly, a gap distance between a direct contact (DC) and the buried contact (BC) is significantly reduced in $6F^2$ BCAT (buried channel array transistor) memory devices, and various problems are caused from the small gap distance between the DC and the BC. For example, contact hole misalignment, a not-open failure of the contact hole (i.e., a failure in which the contact hole is not sufficiently opened), void defects in the BC and a high contact resistance are caused from the small gap distance between the DC and the BC in the BCAT memory devices.

SUMMARY

It is an aspect to provide a semiconductor device in which the contact hole is enlarged between bit lines and a buried semiconductor layer is provided in the active region to thereby reduce the contact resistance of the buried contact.

It is another aspect to provide a method of manufacturing the above semiconductor devices.

According to an aspect of one or more exemplary embodiments, there is provided a semiconductor device including a substrate having a plurality of active regions defined by a device isolation layer; a plurality of word lines extending in a first direction across the plurality of active regions and arranged in a second direction at same intervals; a doped junction having impurities and arranged at the plurality of active regions, the doped junction including a plurality of first junctions and a plurality of second junctions, each of the plurality of first junctions arranged at a central portion of one of the plurality of active regions and each of the plurality of second junctions arranged at an end portion of another one of the plurality of active regions, a buried semiconductor layer being included in each of the plurality of second junctions; a plurality of bit line structures extending in the second direction and arranged in the first direction at same intervals such that each of the plurality of bit line structures makes contact with a respective one of the plurality of first junctions; and a plurality of buried contacts arranged in a matrix shape in the first direction and in the second direction such that each of the plurality of buried contacts makes contact with the a respective one of the plurality of second junctions and the buried semiconductor layer included in the respective one of the plurality of second junctions between neighboring bit line structures and simultaneously makes contact with a charge storage for storing data.

According to another aspect of one or more exemplary embodiments, there is provided a semiconductor device including a substrate having a plurality of active regions defined by a device isolation layer, each active region having a recessed first junction, and a second junction spaced apart from the recessed first junction and having a buried semiconductor layer; a plurality of bit line structures extending in a direction and making contact with a plurality of recessed first junctions in the direction; and a plurality of buried contacts making contact with the second junction and the buried semiconductor layer between neighboring bit line structures and simultaneously making contact with a charge storage for storing data.

According to another aspect of one or more exemplary embodiments, there is provided a semiconductor device including a substrate having a plurality of active regions defined by a device isolation layer; a plurality of word lines extending in a first direction across the plurality of active regions and arranged in a second direction at same intervals, the second direction orthogonal to the first direction; a plurality of first junctions having impurities and arranged at a first portion of the plurality of active regions; a plurality of second junctions having impurities and arranged at a second portion of the plurality of active regions, each second junction including a buried semiconductor layer formed therein, the buried semiconductor layer extending in a third direction that is orthogonal to both the first direction and the second direction; a plurality of bit line structures extending in the second direction and arranged in the first direction at same intervals, each of the plurality of bit line structures making contact with a respective one of the plurality of first junctions; and a plurality of buried contacts arranged in a matrix shape in the first direction and in the second direction, each of the plurality of buried contacts making contact with the a respective one of the plurality of second junctions and the buried semiconductor layer included in the respective one of the plurality of second junctions and simultaneously making contact with a charge storage for storing data.

BRIEF DESCRIPTION OF THE DRAWINGS

The above and other aspects will become more apparent by describing in detail exemplary embodiments thereof with reference to the accompanying drawings of which:

FIG. 2A is a cross-sectional view of the semiconductor device cut along line I-I' of FIG. 1;

FIGS. 3A to 16B are cross sectional views illustrating processing steps for a method of manufacturing the semiconductor device shown in FIGS. 1 to 2B.

DETAILED DESCRIPTION

Figure 1:
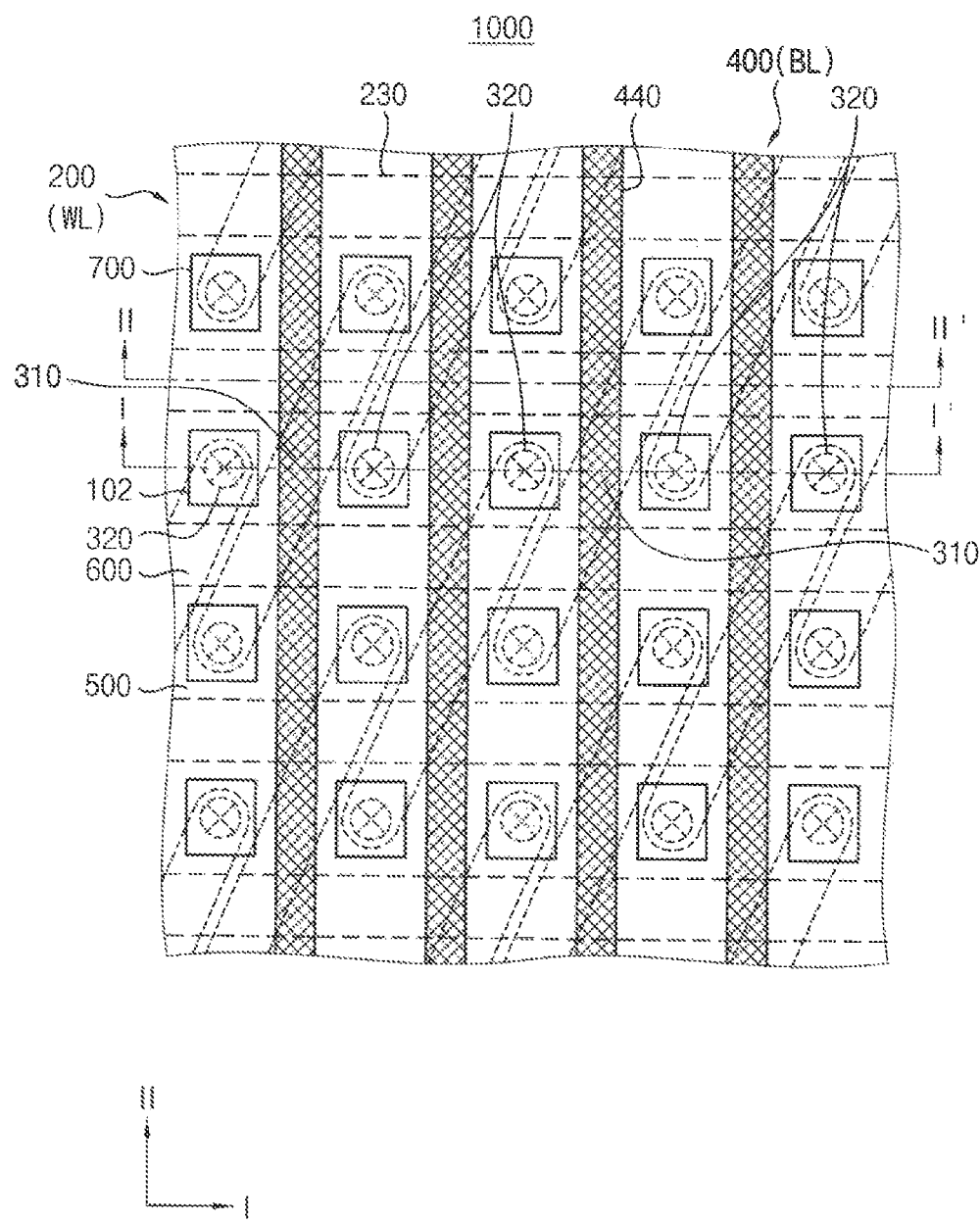
FIG. 1 is a plan view illustrating a semiconductor device in accordance with an example embodiment.

Reference will now be made to example embodiments, which are illustrated in the accompanying drawings, wherein like reference numerals may refer to like components throughout.

According to example embodiments, an insulation pattern may be reduced in such a configuration that a side surface of an inner spacer may be substantially coplanar with a side surface of the insulation pattern and the side surfaces of the inner spacer and the insulation pattern may be covered with an outer spacer. A contact hole may be defined by the outer spacer and a fence pattern. Therefore, the contact hole may be enlarged as much as the reduction of the insulation pattern and thus void or seam defects may be reduced in a buried contact.

In addition, a buried semiconductor layer may be provided in some of a second junction that may constitute the storage contact structure together with the buried contact. Thus, the contact area between the second junction and the storage contact structure may be enlarged due to the boundary surface of the buried semiconductor layer, thereby reducing the contact resistance of the storage contact structure.

Further, the buried semiconductor layer may be formed by a selective etching process to a single crystalline silicon of the second junction, so the buried semiconductor layer may be formed without any damages to a device isolation layer around the second junction. Therefore, current leakage such as GIDL may be sufficiently prevented in spite of the buried semiconductor layer. That is, the contact resistance of the second junction and the storage contact structure may be reduced without current leakage, thereby significantly improving the electric characteristics of the semiconductor device.

Still further, since the second junction may be exposed through a self-aligned etching process to a sacrificial pattern and an anisotropic etching process to a bottom of the outer spacer, the not-open defect of the contact hole may be sufficiently prevented in the manufacturing process for the semiconductor devices.

Various example embodiments are described below.

Figure 2B:
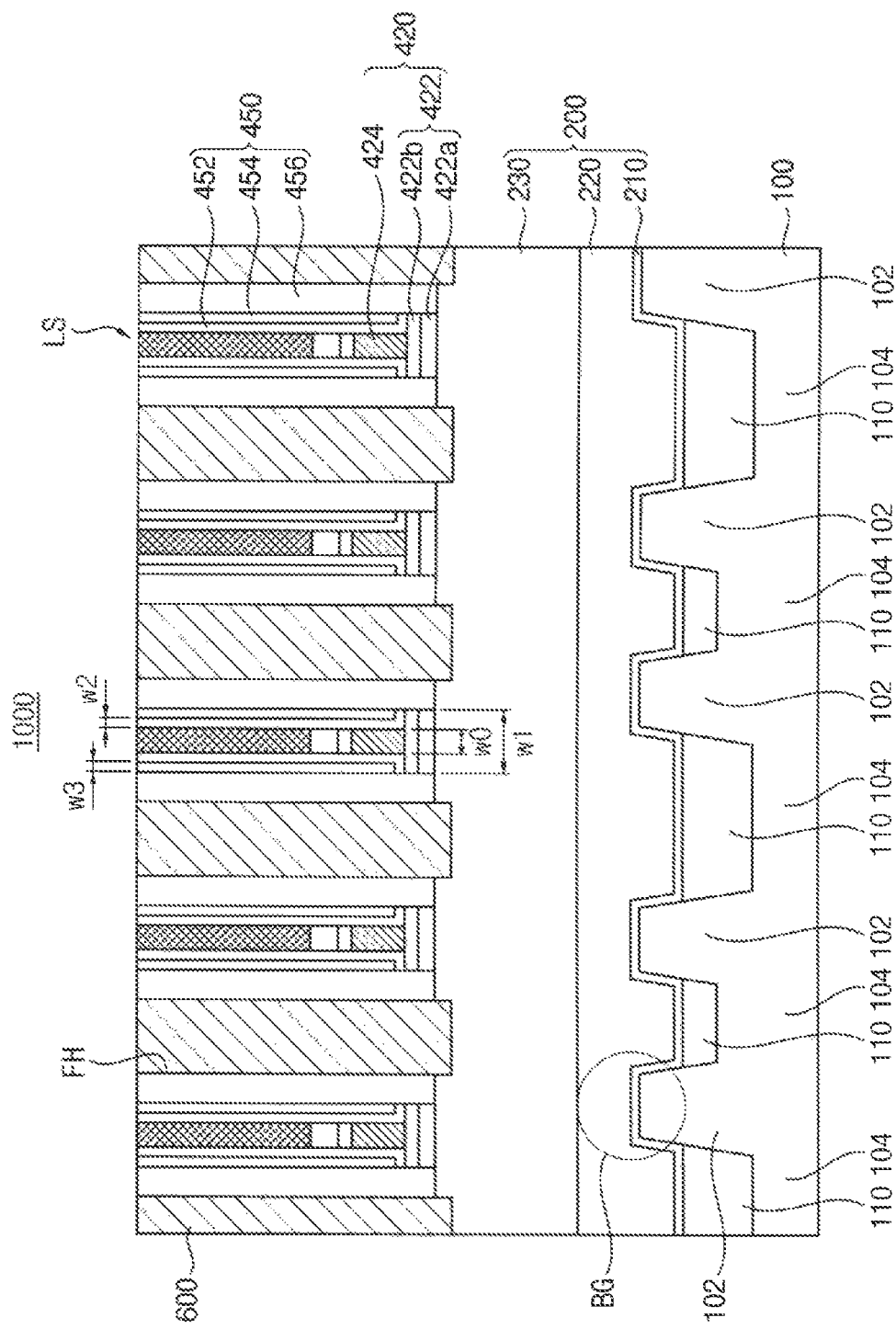
FIG. 2B is a cross-sectional view of the semiconductor device cut along line II-II' of FIG. 1.

FIG. 1 is a plan view illustrating a semiconductor device in accordance with an example embodiment. FIG. 2A is a cross-sectional view of the semiconductor device cut along line I-I' of FIG. 1, and FIG. 2B is a cross-sectional view of the semiconductor device cut along line II-II' of FIG. 1.

Referring to FIGS. 1, 2A and 2B, a semiconductor device 1000 may include a substrate 100 having a plurality of active regions defined by a device isolation layer, a plurality of word lines 200 extending in a first direction I across the active region and arranged in a second direction II at the same intervals, a doped junction 300 having impurities and arranged at the active region such that a first junction may be arranged at a central portion of the active region and a pair of second junctions may be arranged at both end portions of the active region, a plurality of bit line structures 400 extending in the second direction II and arranged in the first direction I at the same intervals such that the bit line contacts a plurality of the first junctions in the second direction and a plurality of storage contacts 500 arranged in a matrix shape in the first direction I and in the second direction II such that the storage contact 500 may make contact with the second junction between the neighboring bit lines.

For example, the substrate 100 may include a semiconductor substrate having a cell area in which a plurality of memory cells for storing data may be arranged and a peripheral area in which a plurality of peripheral devices for driving the memory cells may be arranged. Particularly, a gate structure of a cell transistor is buried in the substrate 100 in the cell area and a gate structure of a peripheral transistor may be arranged on the substrate 100 in the peripheral area, so a plurality of buried cell array transistors is provided in the cell area and a plurality of planar type transistors is provided in the peripheral area.

The substrate 100 may include an active region 102 on which a conductive structure such as a gate structure of the transistor may be arranged and a field region 104 defining the active region 102. A device isolation layer 110 may be arranged in the field region 104 such that the conductive structures on the neighboring active regions 102 may be isolated from one another.

The substrate 100 may include a silicon substrate, a germanium (Ge) substrate, a silicon-on-insulator (SOI) substrate and a germanium-on-insulator (GOI) substrate. The device isolation layer may comprise any one of silicon oxide, silicon nitride and silicon oxynitride.

The active region 102 may be slanted at a constant angle with respect to the first direction I and/or the second direction II, and may be repeatedly arranged at the same intervals, so a plurality of the active regions 102 may be arranged on the substrate 100. Thus, the cell density of the substrate 100 may increase due to the slant configurations of the active regions 102.

In the present example embodiment, a pair of the gate lines 220 may extend in the first direction I across a single active region 102 as the word line WL and a single bit line structure 400 may extend in the second direction II across the central portion of the active region 102. Thus, a pair of the word lines WL and a single bit line BL may cross a single active region in the cell area of the substrate 100 and a pair of cells may be positioned on a single active region 102.

A pair of buried gate structures under a surface of the substrate 100 and a doped junction 300 higher than a top surface of the gate structures may be provided at the active region 102, thereby providing a pair of buried channel transistors in the active region.

A gate trench (not shown) may be provided along the first direction I such that the gate trench may cross the active region 102 and the device isolation layer 110 alternately. A buried gate BG may be provided on the active region of the gate trench and a plurality of the buried gates BG in the gate trench may constitute a gate line 220 extending in the first direction I. The buried gate BG may function as a gate electrode of the semiconductor device 1000 and the gate line 220 may function as a word line WL of the semiconductor device.

For example, the buried gate BG may include a gate insulation layer covering bottom and side surfaces of the gate trench, a gate conductive layer filling a lower portion of the gate trench on the gate insulation layer and a gate capping pattern filling an upper portion of the gate trench on the gate conductive layer.

The gate insulation layer covering the bottom and side surfaces of the gate trench may extend in the first direction I and may be provided as a gate insulation line 210. The gate conductive layer filling the lower portion of the gate trench may also extend in the first direction I and may be provided as the gate line 220. The gate capping pattern filling the upper portion of the gate trench may also extend in the first direction I and may be provided as the gate capping line 230.

The gate conductive layer may comprise any one of doped semiconductors, conductive metal nitrides and conductive metals. The gate insulation layer may comprise any one of an oxide, a nitride, an oxynitride and high dielectric materials (high-K materials). The gate insulation layer is shaped into a capital letter 'U' in the gate trench, because the gate insulation layer may cover the bottom surface and the opposite side surfaces of the gate trench.

The gate capping pattern may be configured to fill up the upper portion of the gate trench, so that the gate trench may be filled up with the gate insulation layer, the gate conductive layer and the gate capping pattern. That is, the gate conductive layer may be buried under the gate capping pattern, so the word line WL may extend in the first direction I with being buried in the substrate 100.

The active region 102 may be divided into active pieces by the buried gate BG and the impurities may be doped into the active pieces, thereby providing the doped junction 300 around the buried gate BG on the active region 102. Since the pair of the gate lines 220 spaced apart from each other may be across the single active region 102, the doped junction 300 may be arranged at a central portion and both end portions of the active region 102. Particularly, the doped junction 300 at the central portion may be recessed downwards and may be provided as the first junction 310, while the doped junction 300 at both end portions may be coplanar with a top surface of the device isolation layer 110 and may be provided as the second junction 320.

In the present example embodiment, the impurities may be implanted onto the active region 102 around the buried gate BG and the first and the second junctions 310 and 320 may function as a drain electrode and a source electrode of the semiconductor device 1000. For example, the impurities may include III-group or V-group materials such as phosphorus (P) or boron (B). Particularly, a bottom surface of the doped junction 300 may be lower than a top surface of the gate insulation layer.

The first junction 310 may be lower than the device isolation layer 110, so that a first recess R1 may be provided over the first junction 310 that may be defined by the first junction 310, the device isolation layer 110 and the gate capping pattern 230. A bit line contact 410 may be positioned in the first recess R1 in such a configuration that the bit line structure 400 may be connected to the first junction 310 via the bit line contact 410, as described in detail hereinafter.

The second junction 320 may have the same upper surface as the device isolation layer 110, so the second junction 320 may be higher than the first junction 310. Particularly, a buried semiconductor layer 320 may be arranged on a portion of the second junction 320 along the bit line structure 400.

An opening exposing the second junction 320 may be formed between the bit lines 400 and the opening may be filled up with the buried semiconductor layer 322, as described in detail hereinafter. Thus, the buried semiconductor layer 322 may be arranged on the second junction 320. In the present example embodiment, the buried semiconductor layer 322 may be buried into the second junction and some of the second junctions 320 may be replaced with the buried semiconductor layer 322, so that the upper surface 322a of the buried semiconductor layer 322 may be the same level as the upper surface of the device isolation layer 110. In addition, a lower surface 322b of the buried semiconductor layer 322 may be higher than or equal to the upper surface of the first junction 310.

The second junction 320 may be electrically connected to a charge storage 700, so that the semiconductor device 1000 may function as a memory device for storing electric data. The second junction 320 may be connected to the charge storage 700 via the buried semiconductor layer 322 and a buried contact 500, which may be described in detail hereinafter. Thus, the buried semiconductor layer 322 and the buried contact 500 may function as a storage contact structure SC of a dynamic random access memory (DRAM) device.

In addition, the second junction 320 may be exposed through a relatively large-sized opening between the neighboring bit lines 400, because the opening may be formed before the outer spacer may be formed on the bit line structure 400. Thus, the not-open (NOP) defect of the second junction 320 may be prevented in the manufacturing processes.

After forming the opening through which the second junction 320 may be exposed, a selective etch process may be conducted to the second junction 320 in such a way that only silicon (Si) of the second junction 320 may be partially removed from the substrate 100 without any removal of the device isolation layer 110 around the second junction 320, thereby forming a second recess R2 at the second junction 320. Then, the buried semiconductor layer 322 may fill up the second recess R2, so that the second junction 320 may make contact with the buried semiconductor layer 322 along the surface of the second recess R2.

Since the buried semiconductor layer 322 may function as the storage contact structure SC together with the buried contact 500, the contact area between the storage contact structure SC and the second junction 320 may be enlarged into the contact area between the buried semiconductor layer 322 and the second junction 320 from the contact area between the second junction 320 and the buried contact 500, thereby sufficiently reducing the contact resistance of the storage contact structure SC.

In the present example embodiment, the first junction 310 may function as the common drain electrode and the second junction 320 may function as the source electrode. However, in other example embodiments, the first junction 310 may function as the common source electrode and the second junction may function as the drain electrode.

Accordingly, the buried gate BG below the top surface of the substrate 100 and the doped junction 300 higher than the top surface of the buried gate BG may constitute the buried cell array transistors (BCAT) on the substrate 100.

The bit line structure 400 may extend in the second direction II and may make contact with the first junctions 310 that may be arranged in series in the second direction II. In addition, a plurality of the bit lines 400 may be arranged in the first direction I at the same intervals. In such a case, the second junction 320 may be positioned between the bit lines 400 adjacent to each other in the first direction I.

For example, the bit line structure 400 may include a bit line contact 410 extending upwards from the first junction 310, a buffer line 420 extending in the second direction II between the bit line contacts 410 neighboring with each other in the second direction II, a conductive bit line 430 making simultaneous contact with the bit line contact 410 and the buffer line in the second direction II, a bit line capping pattern 440 arranged on the bit line 430 as a line shape extending in the second direction II and a bit line spacer 450 covering side surfaces of the bit line contact 410, the buffer line 420, the bit line 430 and the capping pattern 440 and extending in the second direction II.

The bit line contact 410 may include a direct contact (DC) 412 extending from the first junction 310 and making contact with the bit line 420 and a contact spacer 414 enclosing the direct contact 412.

For example, the DC 412 may comprise a conductive material such as polysilicon and the contact spacer 414 may comprise an insulation material such as silicon nitride.

Particularly, the contact spacer 414 may fill up the first recess R1 in such a way that the DC 412 may be enclosed by the contact spacer 414. That is, a lower portion of the DC 412 may be enclosed by the contact spacer 414.

For example, the contact spacer 414 may include a lower spacer 414b that may fill up the first recess R1 and enclose a lower portion of the DC 412 and an upper spacer 414a that may be protruded from the lower spacer 414b and have a thickness smaller than that of the lower spacer 414b. Thus, the upper spacer 414a may be higher than the substrate 100 and be integrally provided in one body in such a way that a middle portion of the DC 412 may be enclosed by the upper spacer 414a.

The buffer line 420 may include an insulation pattern 422 on the substrate 100 and a buffer pattern 424 arranged on the insulation pattern 422 and making contact with the bit line 430.

The insulation pattern 422 may be structured into a single layer structure or a multilayer structure. In the present example embodiment, the insulation pattern 422 may include a base oxide pattern 422a on the substrate 100 and an etch stopper pattern 422b on the base oxide pattern 422a. The base oxide pattern 422a may comprise silicon oxide and the etch stopper pattern 422b may comprise silicon nitride.

The insulation pattern 422 may protect the substrate 100 from various etching processes for forming the bit line capping pattern 440, the bit line 430, the direct contact 412 and the buffer pattern 424. Particularly, when the buffer pattern 424 may be insufficient for protecting the substrate 100 from an etching process for forming the bit line 430, the insulation pattern 422 may function as a supplemental buffer pattern for protecting the substrate 100.

The buffer pattern 424 may prevent the insulation pattern 422 from being over etched in the etching process for forming the bit line 430 and the DC 412, thereby protecting the substrate 100 and the BCAT of the semiconductor device 1000. For that reason, the buffer pattern 424 may have a proper etching selectivity with respect to the bit line 430 and may have an appropriate thickness for preventing the over etch to the insulation pattern 422.

Since the DC 412 may comprise polysilicon and the bit line 430 may comprise a conductive metal, the buffer pattern 424 may comprise a material having a relatively lower etching rate with respect to the polysilicon and the conductive metal in the etching process for forming the bit line 430 and the DC 412. In the present example embodiment, the buffer pattern 424 may include a single layer pattern comprising polysilicon or a multilayer pattern in which an oxide pattern, a nitride pattern and a polysilicon pattern may be stacked.

The conductive bit line 430 may make contact with the buffer pattern 424 and the DC 412 and may be shaped into a line having the same width as the buffer pattern 424 and the direct contact 412.

For example, the bit line 430 may include a barrier pattern 432 making contact with the buffer pattern 424 and the DC 412 and a metal pattern 434 on the barrier pattern 432. The barrier pattern 432 may comprise any one of titanium nitride (TiN), tantalum nitride (TaN) and tungsten nitride (WN) and the metal pattern 434 may comprise any one of titanium (Ti), tantalum (Ta) and tungsten (W).

The bit line capping pattern 440 may cover the metal pattern 434 and protect the metal pattern 434 from surroundings and may function as an etching mask in an etching process for forming the bit line 430, the buffer pattern 424 and the DC 412. For example, the bit line capping pattern 440 may comprise silicon nitride.

The buffer line 420, the bit line 430 and the bit line capping pattern 450 may be sequentially stacked on the substrate 100 into a line structure LS extending in the second direction II. The line structure LS may be connected to the first junction 310 via the bit line contact 410.

In the present example embodiment, the bit line spacer 450 may include a liner spacer 452, an inner spacer 454 and an outer spacer 456.

The liner spacer 452 may cover the side surfaces of the DC 412, the bit line 430 and the buffer pattern 424 and may cover an upper surface of the insulation pattern 422.

The liner spacer 452 may be formed from an etch stop layer (not shown) for forming the contact spacer 414 in the first recess R1 into a line extending in the second direction II.

Thus, the liner spacer 452 may be selectively provided with the bit line spacer 450 in accordance with the process conditions and the configurations of the contact spacer 412. That is, when the etch stop layer may not be required in the etching process for forming the contact spacer 412, no liner spacer may be provided with the bit line spacer 450.

Since the insulation pattern 422 may function as a protection pattern for protecting the substrate 100 and the BCAT in the etching process for forming the bit line structure 400, the width of the insulation pattern 422 may be greater than that of the buffer pattern 424, the bit line 430 and the bit line capping pattern 440 that may be stacked on the insulation pattern 422. Thus, the liner spacer 452 may cover an upper surface of the insulation pattern 422 and the side surfaces of the buffer pattern 424, the bit line 430 and the bit line capping pattern 440.

In the present example embodiment, the contact spacer 412 may comprise a nitride and the liner spacer 452 may comprise an oxide.

The inner spacer 454 may cover the side surface of the liner spacer 452 and may have the same side surface as the insulation pattern 422. The inner spacer 454 may only cover the side surface of the liner spacer 452 and the side surface of the insulation pattern 422 may not be covered by the inner spacer 454.

Thus, the width w1 of the insulation pattern 422 may be the summation of the width w0 of the buffer pattern 424 (or the width of the bit line 430 or the capping pattern 440) and the width of a pair of the inner spacers 454 and a pair of the liner spacers 452, as expressed in the following equation (1).

$$w1 = w0 + 2(w2 + w3) \quad (1),$$

wherein w2 denotes the width of the liner spacer 452 and w3 denotes the width of the inner spacer 454).

Particularly, since the bit line 430 may be supported by the bit line contact 420, not by the buffer line 420, at the first junction 310, the width w3 of the inner spacer 454 may be substantially the same as the width of the upper contact 414a in such a configuration that the side surface of the upper contact 414a may be coplanar with the side surface of the inner spacer 454.

Therefore, the upper portion of the DC 412, which may be protruded from the substrate 100, may be enclosed by the liner spacer 452, the inner spacer 454 and the upper spacer 414a. In contrast, a lower portion of the DC 412, which may be positioned in the first recess R1 under the top surface of the substrate 100, may be enclosed by the lower contact 414b and the liner spacer 452.

In such a case, the shapes and configurations of the lower spacer 414b may be varied according to the shape of the first recess R1. In the present example embodiment, since the first recess R1 may be shaped into a reverse trapezoid, the lower spacer 414b may be shaped into a reverse triangle.

Therefore, the inner spacer 454 may have the same side surface as the upper spacer 414a and the insulation pattern 422, so the second junction 320 may be exposed through a trench T that may be defined by the inner spacer 454 and the insulation pattern 422.

The outer spacer 456 may be formed on the sidewall of the trench T in such a way that the outer spacer 456 may extend upwards from the substrate 100, so the side surfaces of the inner spacer 454, the insulation pattern 422 and the upper spacer 414a may be covered with the outer spacer 456.

Thus, the side surfaces of the bit line 430, the DC 412, the buffer pattern 424 may be covered with the bit line spacer 450 and the upper surface of the bit line 430 may be covered with the bit line capping pattern 440, so that the bit line 430, the DC 412, the buffer pattern 424 may be protected from surroundings by the bit line spacer 450 and the bit line capping pattern 440.

Particularly, since the lower spacer 414b may have a width greater than that of the upper spacer 414a, the upper surface of the lower spacer 414b may be the same level as that of the device isolation layer 110. The upper surface of the lower spacer 414b may be selectively covered with the outer spacer 456 according to a width of the outer spacer 456.

In addition, the liner spacer 452 may further include a branch spacer 459 interposed between the device isolation layer 110 and the lower spacer 414b in the first recess R1.

In the present example embodiment, the branch spacer 459 may enclose the lower spacer 414b in such a configuration that an upper surface of the branch spacer 459 may have the same level as the upper surface of the lower contact 414b. Thus, the branch spacer 459 may also be selectively covered with the outer spacer 456 according to the width of the outer spacer 456.

Accordingly, the outer spacer 456 may cover the side surfaces of the inner spacer 454 and the upper spacer 414a and may cover the upper surfaces of the branch spacer 459 and the lower spacer 414b around the first junction 310. In contrast, the outer spacer 456 may cover the active region 102 and/or the buried semiconductor layer 322. Thus, the buried semiconductor layer 322 and the device isolation layer 110 may be exposed to a contact hole CH defined by the outer spacer 456.

The bit line contact 410, the buffer line 420, the bit line 430, the bit line capping pattern 440 and the bit line spacer 450 may constitute the bit line structure 400.

In the present example embodiment, the bottom surface of the bit line structure 400 may have substantially the same level as a bottom surface of the peripheral gate, so that the bit line structure 400 may be provided as a gate bit line (GBL) structure. A bit line signal may be transferred to the drain electrode of the BCAT.

The buried contact (BC, 500) may fill up the contact hole CH and the charge storage 700 may be connected to the second junction 320 via the buried contact 500.

The BC 500 may be interposed between the neighboring bit line structures 400 and may make contact with the second junction 320 and the buried semiconductor layer 322. Accordingly, a plurality of the buried contacts 500 may be arranged into a matrix shape along the first and the second directions I and II.

The buried semiconductor layer 322 may be buried into some portion of the second junction 320, so that the buried semiconductor layer 322 may make contact with the buried semiconductor layer 322 as well as the device isolation layer 110. Thus, the buried semiconductor layer 322 may function as a storage contact structure SC together with the buried contact 500. Thus, the contact area between the second junction 320 and the storage contact structure SC may be enlarged as large as the inner surface of the second recess R2, thereby reducing the contact resistance between the second junction 320 and the storage contact structure SC. Accordingly, the electric characteristics of the semiconductor device 1000 may be significantly improved due to the buried semiconductor layer 320.

In the related art storage contact structure, the buried contact may make contact with only the upper surface of the second junction, and the contact area between the buried contact and the second junction may be very small and may tend to be still reduced due to the high integration degree of the semiconductor devices. Thus, the contact resistance between the second junction and the buried contact may tend to increase, which causes the electrical instability of the semiconductor devices. In addition, the small size of the contact area increases the process margin of the etching process for forming the contact hole through which the second junction is exposed. However, the buried semiconductor layer 322 may be formed in advance before the formation of the contact hole, and then the buried contact 500 may be formed in such a way that the buried contact 500 may make contact with the buried semiconductor layer 322. Thus, the contact area between the buried contact 500 and the second junction 320 may be remarkably increased to thereby prevent the electrical instability of the semiconductor devices 1000 in spite of the technical trend of the high integration degree and size reduction.

A fence pattern 600 may fill up a gap space between the neighboring bit line structures 400 on the word lines 200 and the contact hole CH may be formed by a self-aligned etching process using the fence pattern 600 and the outer spacer 456 as an etching mask.

The fence pattern 600 may comprise any one of an oxide, a nitride and an oxynitride, and the contact hole CH may be filled with conductive materials, thereby forming the buried contact 500 in the contact hole CH. Examples of the conductive materials for the buried contact 500 may include semiconductor materials such as polysilicon, a composition of metal and semiconductor materials such as a tungsten silicide (WSi), a conductive metal nitride such as titanium nitride (TiN), tantalum nitride (TaN) and tungsten nitride (WN) and a conductive metal such as titanium (Ti), tantalum (Ta) and tungsten (W).

In the present example embodiment, the buried contact 500 may be provided as the storage contact structure SC that may be connected to the source electrode of the BCAT and to the charge storage 700 over the source electrode.

In the present example embodiment, since the contact hole CH may be formed by the self-aligned etching process using the outer spacer 456 as an etching mask, the buried contact 500 may make contact with the outer spacer 456.

Particularly, since the second junction 320 may be exposed only by removing the bottom of an outer spacer layer (not shown) that may cover the bottom of the contact hole CH, the process margin of the etching process for forming the contact hole CH may sufficiently increase. Accordingly, the not-open defect may be sufficiently prevented in the contact hole CH.

In addition, since the side surfaces of the inner spacer 454 and the insulation pattern 422 may be coplanar with each other and the side surfaces of the inner spacer 454 and the insulation pattern 422 may be covered with the outer spacer 456, the contact hole CH may be defined only by the outer spacer 456 irrespective of the insulation pattern 422. In the related art contact hole, the outer spacer is positioned on the insulation pattern and thus the contact hole size is determined by the insulation pattern. However, the width of the insulation pattern 422 may be reduced in such a way that the side surface of the inner spacer 454 may be substantially coplanar with the side surface of the insulation pattern 422 and thus the contact hole CH of the present inventive concept may be enlarged as large as the reduced width of the insulation pattern 422. Since the contact hole CH may be enlarged as compared with the related art contact hole, the aspect ratio of the contact hole CH may be reduced and thus void or seam defects of the buried contact 500 may be sufficiently reduced. In addition, the size of the contact hole CH may be controlled only by varying the width of the outer spacer 456, the control to the aspect ratio of the contact hole CH may be facilitated in the etching process for forming the contact hole CH.

An insulation interlayer (not shown) may be formed on the bit line structure 400, the buried contact 500 and the fence pattern 600 and the charge storage 700 may be formed on the insulation interlayer. The charge storage 700 may be connected to the buried contact 500 through the insulation interlayer.

The charge storage 700 may have various structures according to the structures of the semiconductor devices 1000.

For example, the charge storage 700 may include a capacitor having a lower electrode (not shown), a dielectric layer (not shown) covering the lower electrode along a surface profile of the lower electrode and an upper electrode covering the dielectric layer. In contrast, the charge storage 700 may include a variable resistance structure in which a lower electrode (not shown), a resistance variable resistor (not shown) and an upper electrode (not shown) may be sequentially stacked on the insulation interlayer.

According to the example embodiments of the semiconductor devices 1000, the inner spacer 454 may be formed in such a configuration that the side surface of the inner spacer 454 may be coplanar with the side surface of the insulation pattern 422 and the contact hole CH may be defined by the outer spacer 456 that may cover the side surfaces of the inner spacer 454 and the insulation pattern 422. Thus, the size of the contact hole CH may increase as much as the reduced width of the insulation pattern 422, and thus void or seam defects may be sufficiently reduced in the buried contact 500.

In addition, some of the second junctions 320 may be replaced with the buried semiconductor layer 322 and the buried contact 500 may make contact with the second junction 320 and the buried semiconductor layer 322. When the buried contact 500 may have the same materials as the buried semiconductor layer 322, the buried semiconductor layer 322 may function as the storage contact structure SC together with the buried contact 500. Therefore, the contact area between the storage contact structure SC and the second junction 320 may be enlarged due to the contact area between the second junction 320 and the buried semiconductor layer 322, thereby sufficiently reducing the contact resistance between the storage contact structure SC and the second junction 320.

Further, since the second recess R2 for forming the buried semiconductor layer 322 may be formed by a selective etching process in which the single crystalline silicon of the second junction 320 may be etched off without etching the device isolation layer 110, the storage contact structure SC may be provided in the contact hole CH without any damage to the device isolation layer 110 around the second junction 320. Accordingly, the contact area between the second junction 320 and the storage contact structure SC may increase without minimizing the leakage current such as gate induced drain leakage (GIDL) current.

Still further, since the second junction 320 may be exposed through the bit line trench T that may be defined by the inner spacer 454 and the insulation pattern 422 prior to the formation of outer spacer 456, the second junction 320 may be fully exposed as compared with the related art case in which the second junction may be exposed though the related art contact hole, not through the trench, so that the not-open defect may be sufficiently prevented in the contact hole CH.

FIGS. 3A to 16B are cross sectional views illustrating processing steps for a method of manufacturing the semiconductor device shown in FIGS. 1 to 2B. In FIGS. 3A to 13B, the subscript 'a' indicates the cross sectional view cut along line I-I' of FIG. 1 and the subscript 'b' indicates the cross sectional view cut along line II-II' of FIG. 1.

Figure 3A:
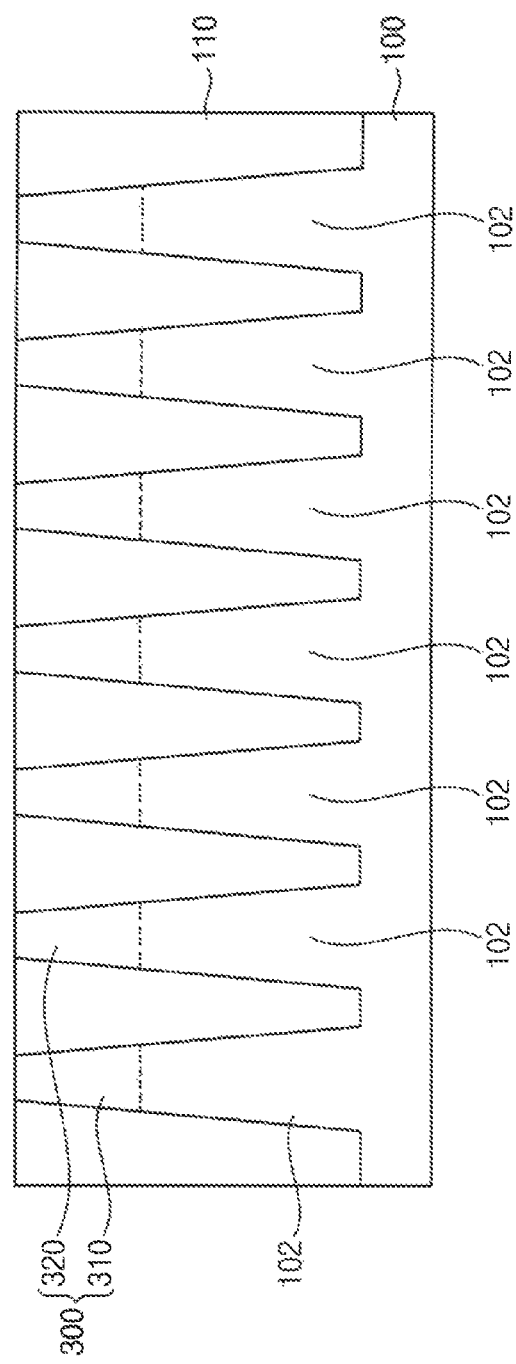
Figure 3B:
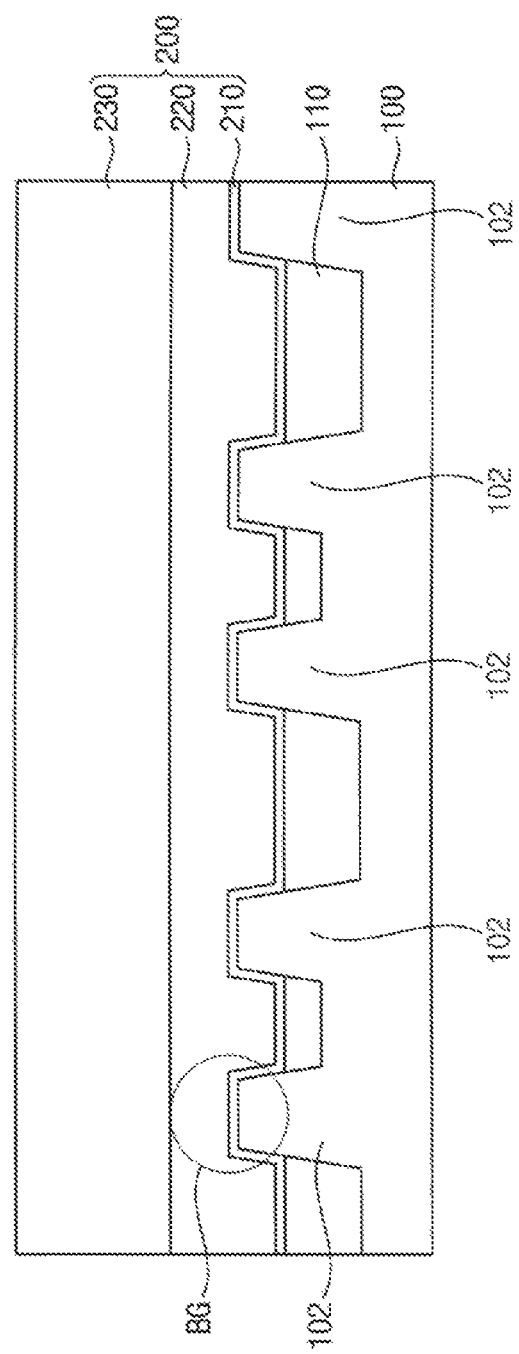

Referring to FIGS. 1, 3A and 3B, the buried gate line 220 and the doped junction 300 may be provided on the substrate 100 in such a configuration that the buried gate line 220 may extend in the first direction I across a plurality of the active regions 102 in the substrate 100 and the doped junction 300 may be provided on the active region 102 around the buried gate line 220.

The substrate 100 may include an active region 102 on which a conductive structure such as a gate structure of the transistor may be arranged and a field region 104 defining the active region 102. A device isolation layer 110 may be arranged in the field region 104 such that the conductive structures on the neighboring active regions 102 may be isolated from one another.

The substrate 100 may include a silicon substrate, a germanium (Ge) substrate, a silicon-on-insulator (SOI) substrate and a germanium-on-insulator (GOI) substrate. The device isolation layer may comprise any one of silicon oxide, silicon nitride and silicon oxynitride.

For example, the device isolation layer 110 may be formed by a shallow-trench isolation (STI) process. A hard mask (not shown) may be formed on the substrate 100 and an anisotropic etching process may be conducted to the substrate 100 using the hard mask as an etching mask, thereby forming a device isolation trench on the substrate 100. The device isolation trench may be filled up with the insulation materials, thereby forming the device isolation layer 110 in the device isolation trench. For example, the insulation material for the device isolation layer 110 may include any one of silicon oxide, silicon nitride and silicon oxynitride.

Thus, a plurality of the active regions 102 defined by the device isolation layer 110 may be formed into isolated islands on the substrate 100. In the present example embodiment, the active region 102 may be slanted at a constant angle with respect to the first direction I and/or the second direction II and may be repeatedly arranged at the same intervals, so a plurality of the active regions 102 may be arranged on the substrate 100.

A plurality of gate trenches (not shown) may be formed on the substrate 100 in the first direction I and may be spaced apart from each other in the second direction II at the same intervals. In the present example embodiment, a pair of the gate trenches may be across the single active region 102. The device isolation layer 110 and the active region 102 may be partially recessed in the gate trench, so that recessed active region and the recessed device isolation layer may be provided in the gate trench.

A preliminary cell gate insulation layer (not shown) may be formed on the substrate 100 and the surfaces of the gate trenches and a preliminary cell gate conductive layer (not shown) may be formed on the preliminary cell gate insulation layer to a sufficient thickness to fill up the gate trench. Then, the preliminary cell gate insulation layer and the preliminary cell gate conductive layer may be planarized until the top surface of the substrate 100 may be exposed, so that the preliminary cell gate insulation layer and the preliminary cell gate conductive layer may only remain in the gate trench. Then, the preliminary cell gate conductive layer may be reduced to a lower portion of the gate trench, thereby forming a cell gate insulation layer and a cell gate conductive layer in the gate trench.

Thus, the cell gate insulation layer and the cell gate conductive layer on the recessed active region 102 may be formed into the gate insulation line 210 and the gate line 220 having the buried gate BG, respectively, in the gate trench. Thereafter, an upper portion of the gate trench may be filled up with insulation materials, thereby forming the gate capping line 230 in the first direction I.

The gate insulation line 210, the gate line 220 and the gate capping line 230 may be formed into the word line WL extending in the first direction I and the buried gate BG may be under the gate capping line 230.

The active regions 102 between the gate capping lines 230 neighboring with each other in the second direction II may be exposed to surroundings in the first direction I in such a configuration that the active regions 102 and the device isolation layer 110 may be alternately exposed in the first direction I. Therefore, the exposed active regions 102 may be isolated by the device isolation layer 110 and the gate capping line 230 like isolated islands in a matrix shape.

In the present example embodiment, since a pair of the gate lines 220 may be across the single active region 102, a pair of the buried gates BG spaced apart from each other may be arranged on the single active region 102. The both end portions of the active region 102 and the central portion of the active region 102 between the buried gates BG may be provided as the junction area for the doped junction 300.

Impurities may be implanted onto the surface portions of the junction area of the active region 102, thereby forming the doped junction 300. The doped junction 300 include the first junction 310 that may be positioned at the central portion of the active region 102 and a pair of the second junctions 320 that may be positioned at both end portions of the active region 102.

The gate line 220 having the buried gate BG and the doped junction 300 may be formed into the buried channel array transistor (BCAT) on the substrate 100.

Figure 4A:
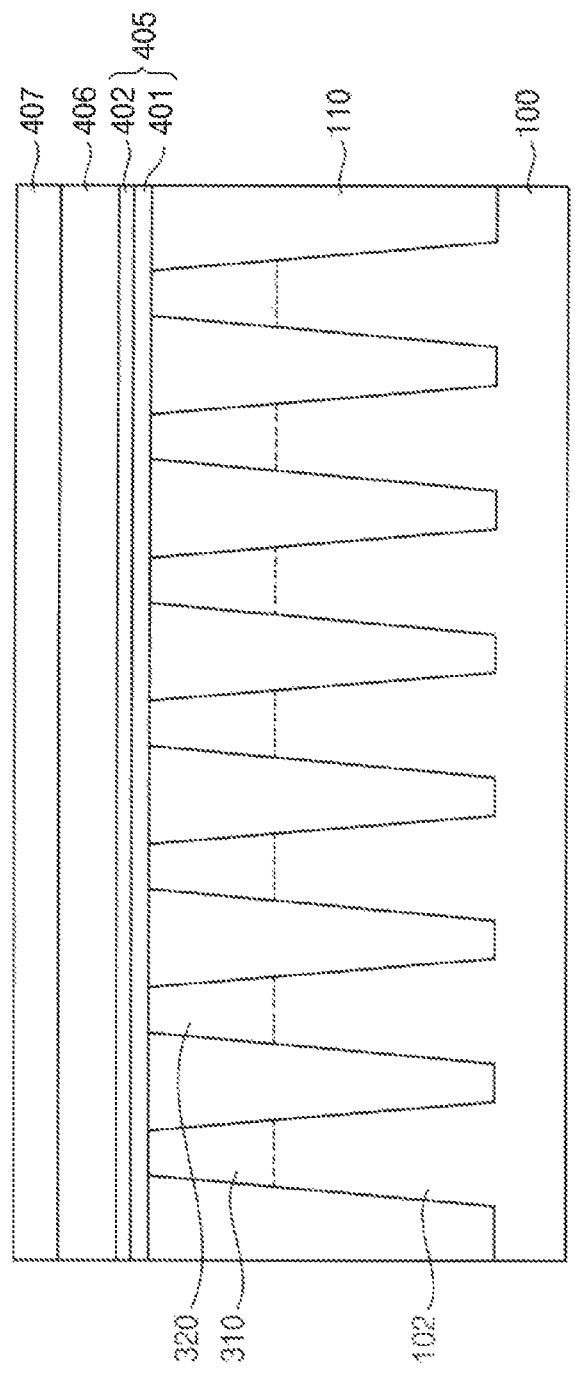
Figure 4B:
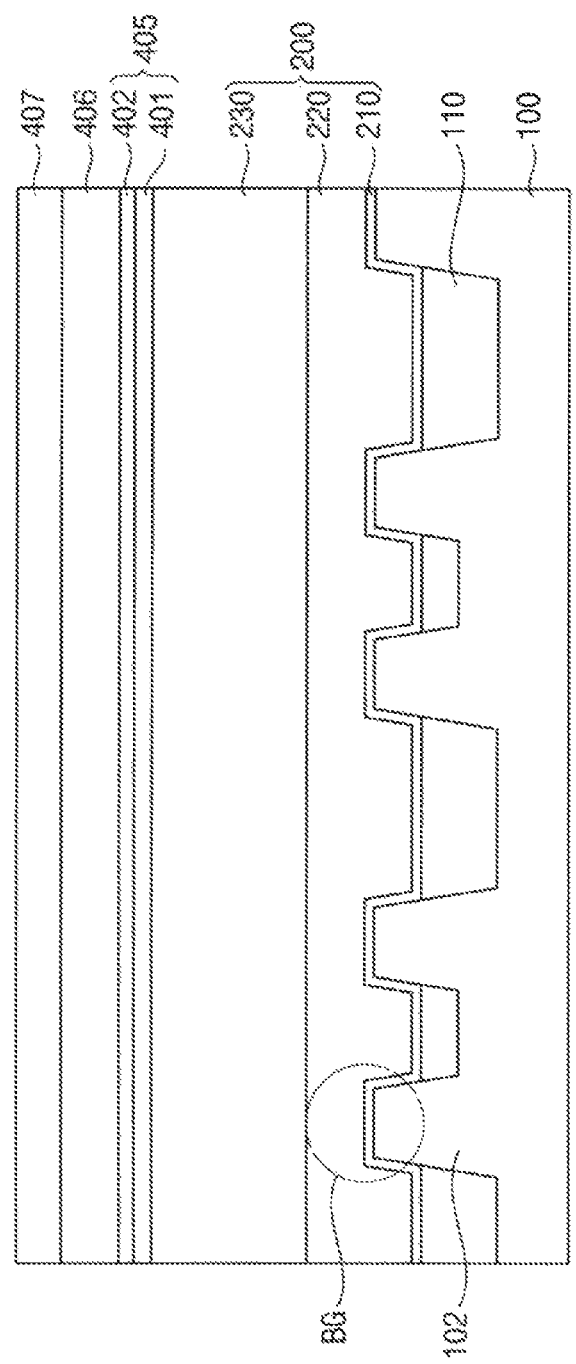

Referring to FIGS. 1, 4A and 4B, an insulation layer 405, a buffer layer 406 and a sacrificial layer 407 may be sequentially formed on a whole surface of the substrate 100 on which the word line WL may be formed.

For example, a base oxide layer 401 comprising silicon oxide may be formed on the whole surface of the substrate 100 by a deposition process or a spin coating process, and then an etch stop layer 402 may be formed on the base oxide layer 401 by a deposition process. The etch stop layer 402 may comprise silicon nitride or silicon oxynitride. Accordingly, an insulation layer 405 having the base oxide layer 401 and the etch stop layer 402 may be formed on the substrate 100.

Then, the buffer layer 406 may be formed on the etch stop layer 402. The buffer layer 406 may comprise a material having an appropriate etch rate in a subsequent metal etching process. For example, the buffer layer 406 may comprise polysilicon.

Thereafter, the sacrificial layer 407 may be formed on the buffer layer 406. The sacrificial layer 407 may protect the buffer layer 406 in a subsequent etching process. In the present example embodiment, the sacrificial layer 407 may comprise silicon oxide.

Figure 5A:
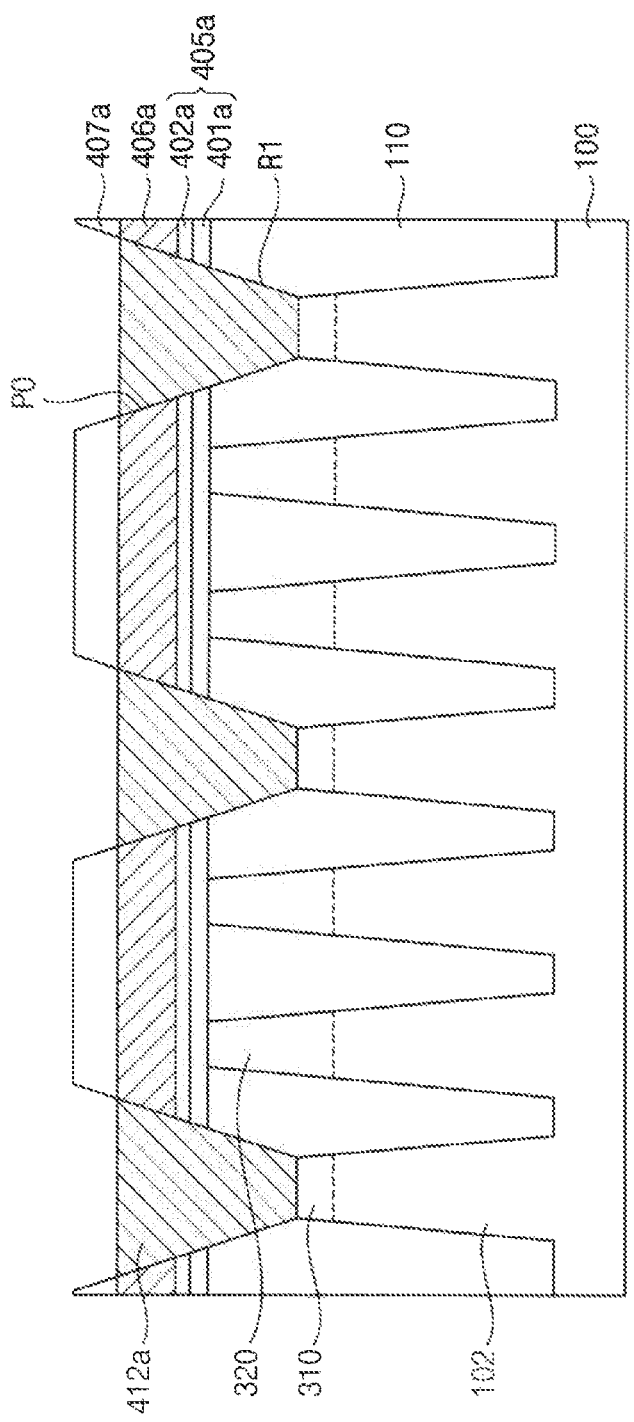
Figure 5B:
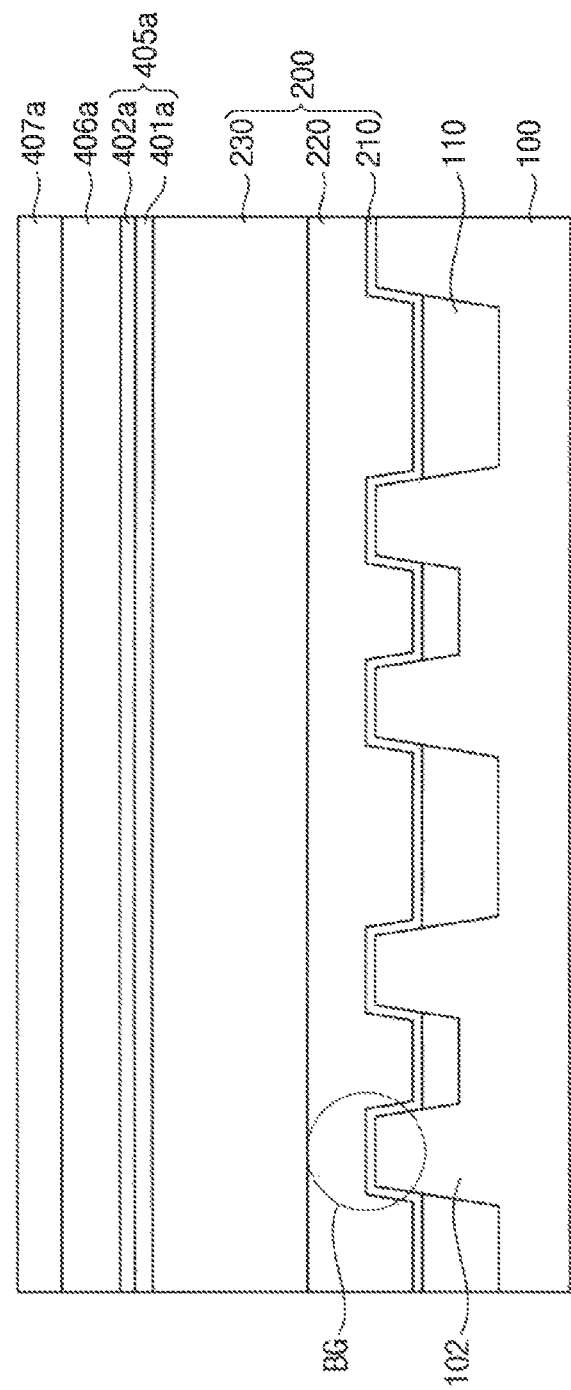

Referring to FIGS. 1, 5A and 5B, the sacrificial layer 407, the buffer layer 406 and the insulation layer 405 may be partially removed from the substrate 100 in such a way that the first junction 310 may be exposed and then the first junction 310 may also be removed from the substrate 100 until the upper surface of the first junction 310 may be lowered under the upper surface of the second junction 320, thereby forming the first recess R1 around the first junction 310.

For example, a mask pattern (not shown) may be formed on the sacrificial layer 407 in such a way that the sacrificial layer 407 over the first junction 310 may be exposed through the mask pattern. Then, the sacrificial layer 407, the buffer layer 406, the insulation layer 405 and the first junction 310 may be sequentially etched off from the substrate 100 by an etching process using the mask pattern as an etching mask, thereby forming a preliminary opening PO and the first recess R1 that may be communicated with the preliminary opening PO.

Accordingly, the first junction 310 may be lowered under the second junction 320 and the reduced first junction 310 may be exposed through the first recess R1 and the preliminary opening PO. The sacrificial layer 407, the buffer layer 406 and the insulation layer 405 may be formed into a sacrificial pattern 407a, a preliminary buffer pattern 406a and a preliminary insulation pattern 405a having a preliminary base oxide pattern 401a and a preliminary etch stop pattern 402a having the preliminary opening PO. The upper portion of the first junction 310 may be removed from the substrate 100, thereby forming the reduced first junction 310 and the first recess R1 above the first junction 310. The preliminary opening PO may be defined by the preliminary buffer pattern 406a and the preliminary insulation pattern 405a and the first recess R1 may be defined by the device isolation layer 110 and the gate capping line 230.

Then, the first recess R1 may be filled with conductive materials, thereby forming a preliminary contact 412a in the first recess R1.

For example, a conductive contact layer (not shown) may be formed on a whole surface of the mask pattern to a sufficient thickness to fill up the first recess R1 and the preliminary opening PO by a deposition process such as a chemical vapor deposition (CVD) process. Then, conductive contact layer may be planarized by a planarization process such as a chemical mechanical polishing (CMP) process until an upper surface of the preliminary buffer pattern 406a and the conductive contact layer may remain only in the first recess R1, thereby forming the preliminary contact 412a in the first recess R1 and the preliminary opening PO. The mask pattern and the sacrificial pattern 407a may be removed from the substrate 100 in the planarization process.

In the present example embodiment, the preliminary contact 412a may comprise polysilicon like the buffer layer 406. The upper surface of the preliminary contact 412a may be substantially coplanar with an upper surface of the preliminary buffer pattern 406a.

Figure 6A:
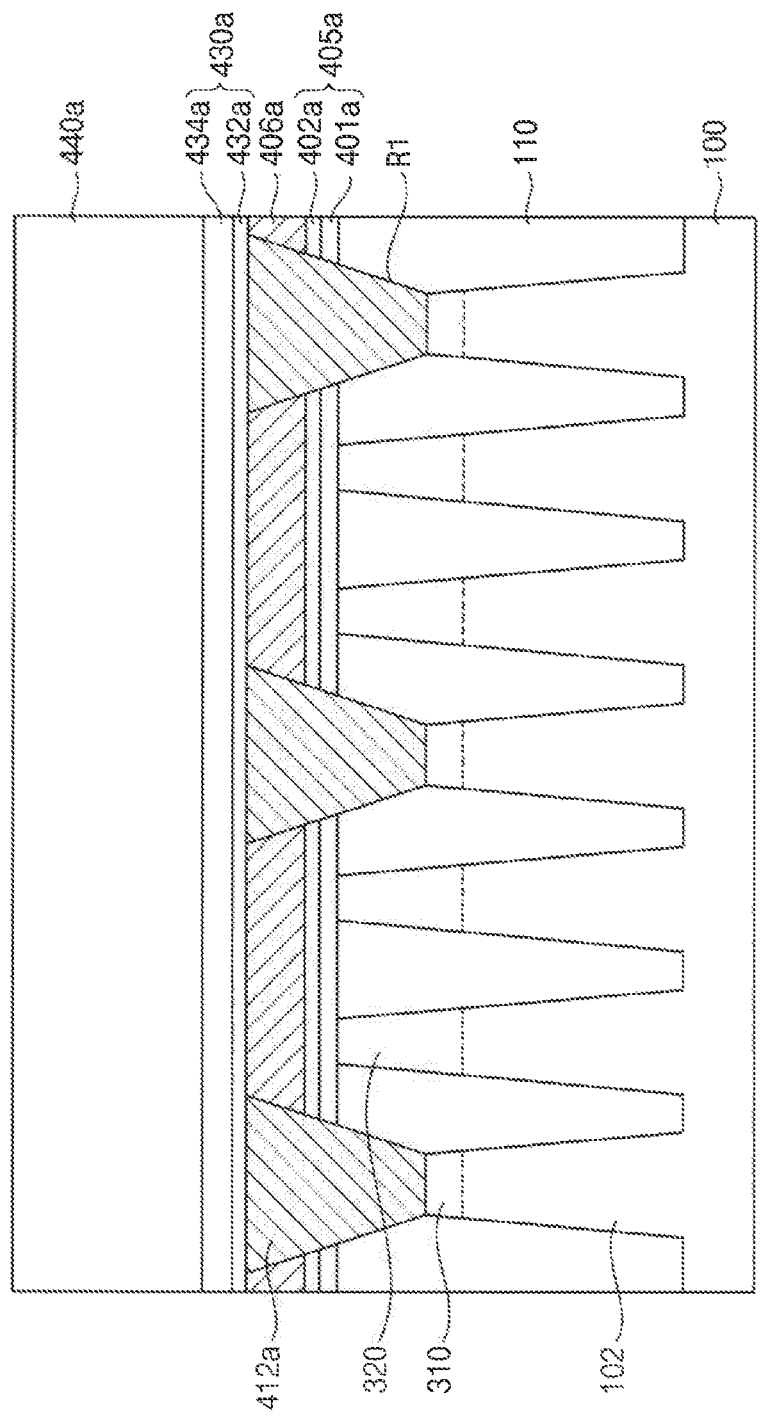
Figure 6B:
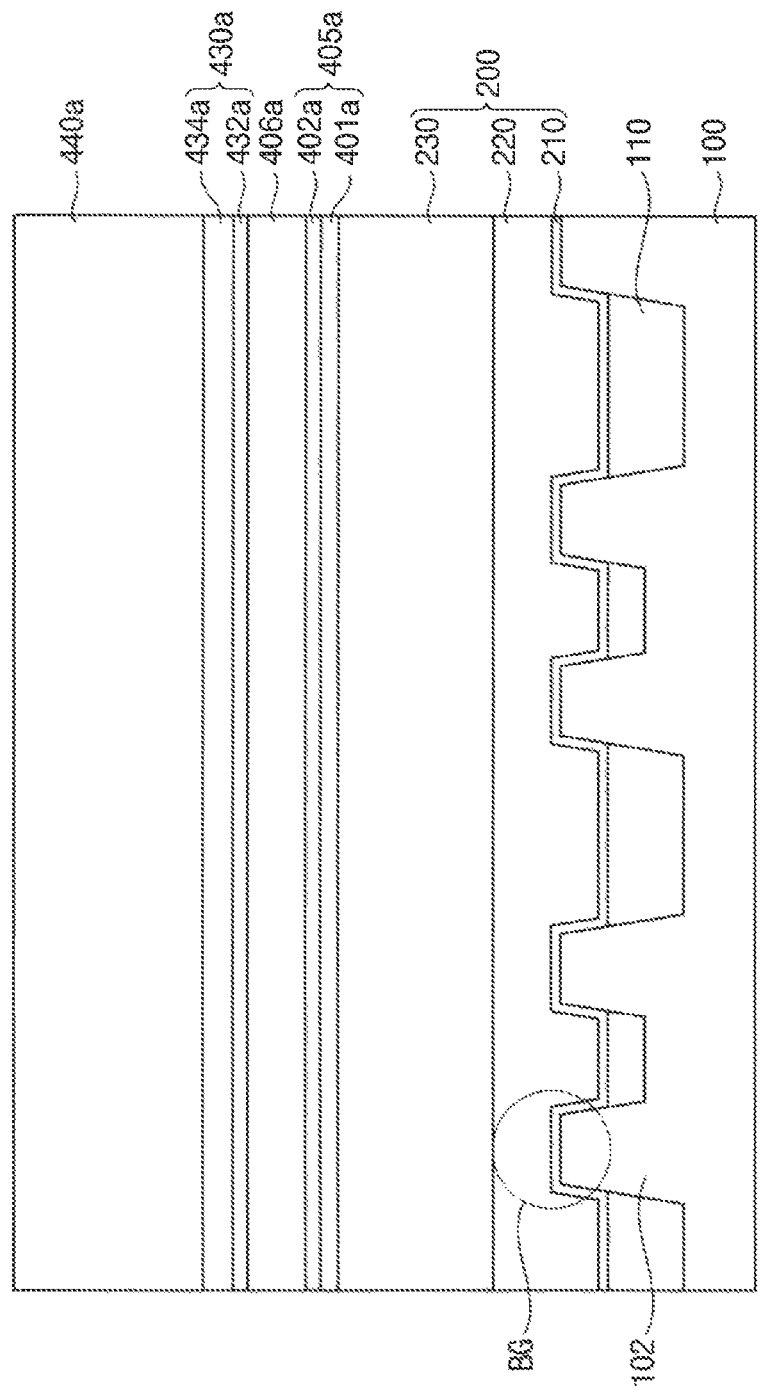

Referring to FIGS. 1, 6A and 6B, a bit line conductive layer 430*a* may be formed on the preliminary contact 412*a* and the preliminary buffer pattern 406*a*.

For example, a barrier layer 432*a* may be formed on the preliminary contact 412*a* and the preliminary buffer pattern 406*a* by a CVD process. The barrier layer 432*a* may comprise a conductive metal nitride such as titanium nitride (TiN), tantalum nitride (TaN) and tungsten nitride (WN). Then, a conductive metal layer 434*a* may be formed on the barrier layer 432*a* and a capping layer 440*a* may be formed on the metal layer 434*a* by a CVD process, a physical vapor deposition (PVD) process or a sputtering process.

The conductive metal layer 434*a* may comprise a low resistive metal such as ruthenium (Ru), iridium (Ir), titanium (Ti), tantalum (Ta) and tungsten (W), and the capping layer 440*a* may comprise any one of an oxide, a nitride, an oxynitride and compositions thereof.

Figure 7A:
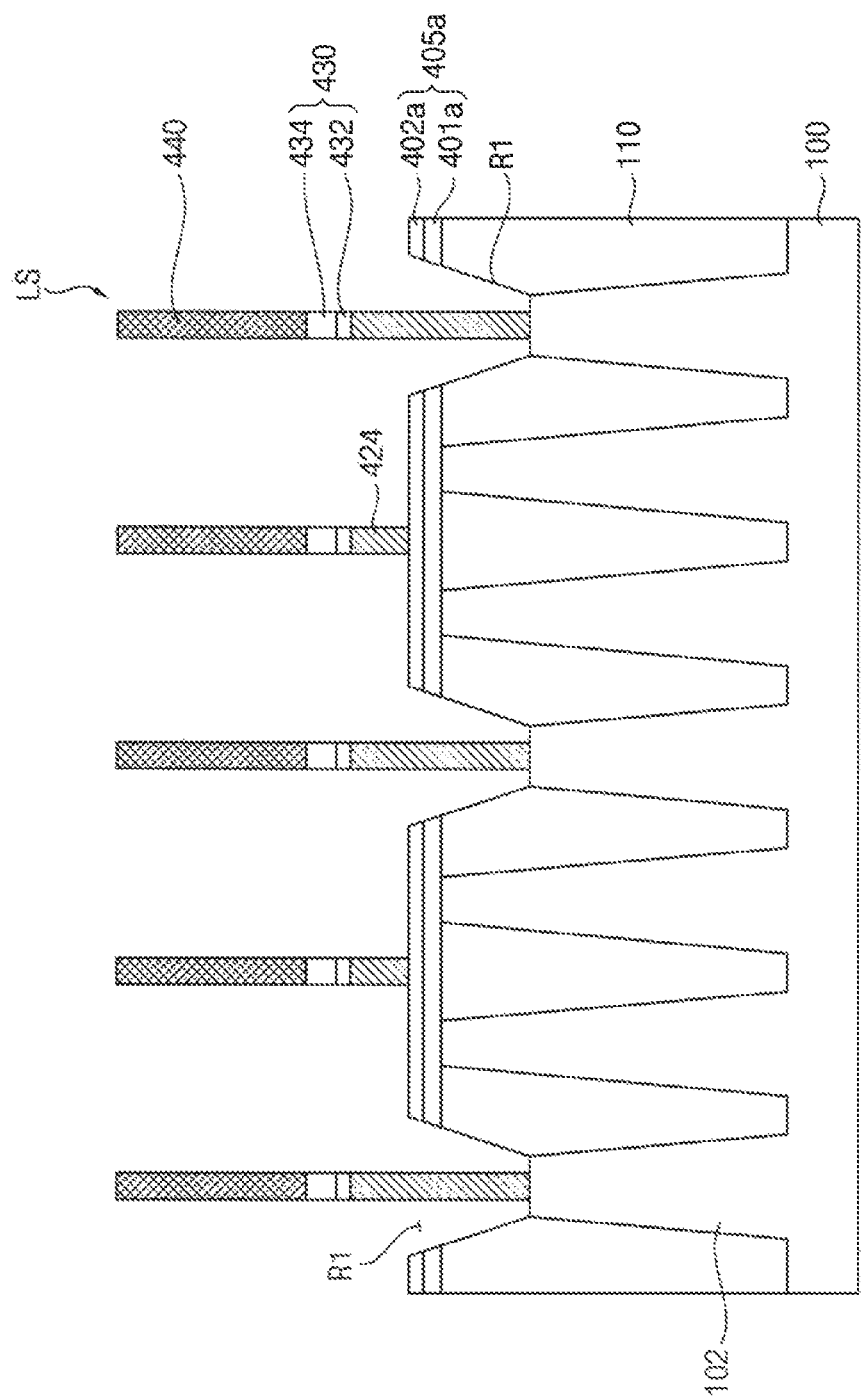
Figure 7B:
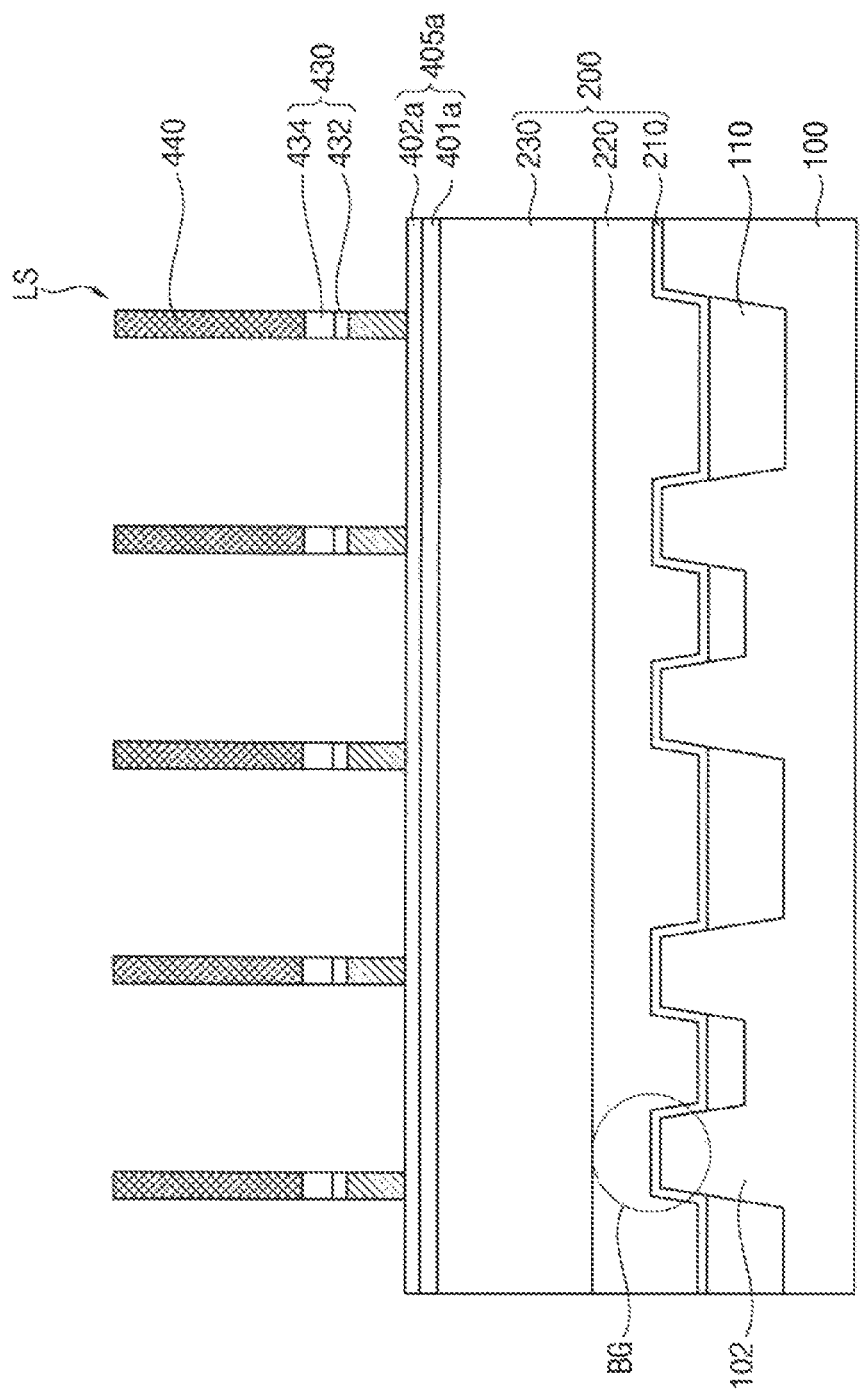

Referring to FIGS. 1, 7A and 7B, the capping layer 440*a*, the metal layer 434*a*, the barrier layer 432*a*, the preliminary buffer pattern 406*a* and the preliminary contact 412*a* may be sequentially patterned into a line structure LS extending in the second direction II in which the buffer pattern 424, the conductive bit line 430 and the bit line capping pattern 440 may be sequentially stacked on the preliminary insulation pattern 405*a* and the direct contact 412, the conductive bit line 430 and the bit line capping pattern 440 may be sequentially stacked on the first junction 310 in the first recess R1.

The capping layer 440*a*, the metal layer 434*a*, the barrier layer 432*a*, the preliminary buffer pattern 406*a* and the preliminary contact 412*a* may be formed into the bit line capping pattern 440, the metal pattern 434, the barrier pattern 432, the buffer pattern 424 and the direct contact 412 by the patterning process. The direct contact 412 may be formed on the first junction 310 in the first recess R and the conductive line 430 having the barrier pattern 432 and the metal pattern 434 and the bit line capping pattern 440 may be stacked on the direct contact 412, so that the line structure LS may include the direct contact 412, the conductive line 430 and the bit line capping pattern 440 sequentially stacked on the first junction 310. In contrast, the line structure LS may include the buffer line 424, the conductive line 430 and the bit line capping pattern 440 that may be sequentially stacked on the preliminary insulation pattern 405*a*.

For example, a bit line mask pattern (not shown) may be formed on the capping layer 440*a* and a plasma etching process may be conducted using the bit line mask pattern as an etching mask.

Therefore, a plurality of the line structures LS may be shaped into a line extending in the second direction II and may be arranged at the same intervals in the first direction I. The line structure LS may extend on the preliminary insulation pattern 405*a* and may be connected to the first junction 310 via the direct contact 412.

Figure 8A:
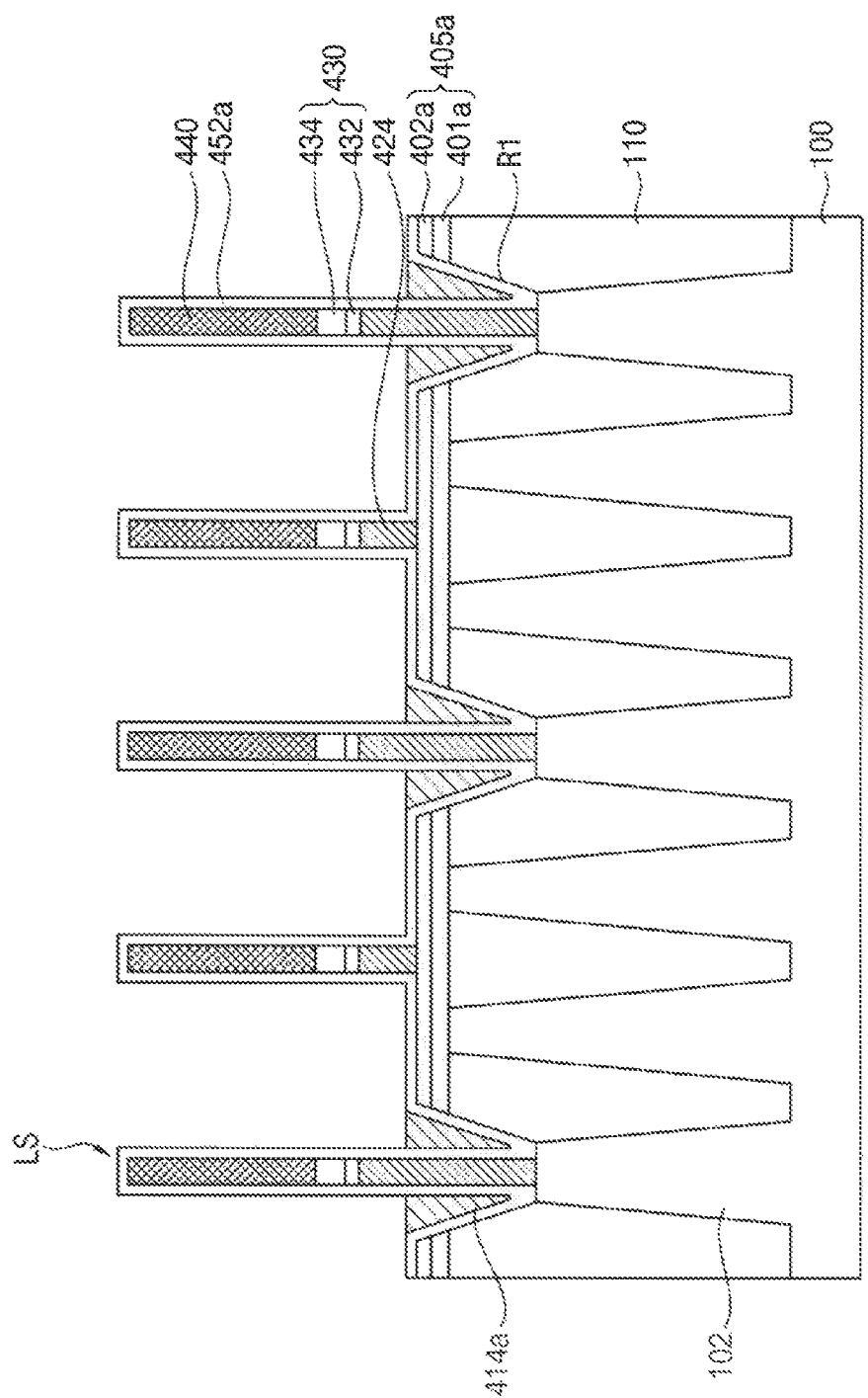

Referring to FIGS. 1, 8A and 8B, a liner spacer layer 452*a* may be formed on the substrate 100 along a surface profile of the line structure LS and a preliminary contact spacer 414*a* may be formed in the first recess R1. Thus, the direct contact 412 may be enclosed by the preliminary contact spacer 414*a*.

For example, the liner spacer layer 452*a* may be formed along the surface profile of the line structure LS and the first recess R1 by a deposition process, and a contact spacer layer (not shown) may be formed on the substrate 100 to a sufficient thickness to fill up the first recess R1. In the present example embodiment, the liner spacer layer 452*a* may comprise an oxide and the contact spacer layer may comprise a nitride.

Then, an anisotropic process may be conducted to the contact spacer layer using the liner spacer layer 452*a* as an etching mask in such a way that the contact spacer layer may remain only in the first recess R1, thereby forming the preliminary contact spacer 414*a* in the first recess R1.

Some of the liner spacer layer 452*a* enclosed by the preliminary contact spacer 414*a*, the device isolation layer 110 and the gate capping line 230 may be provided as the branch spacer 459.

Figure 9B:
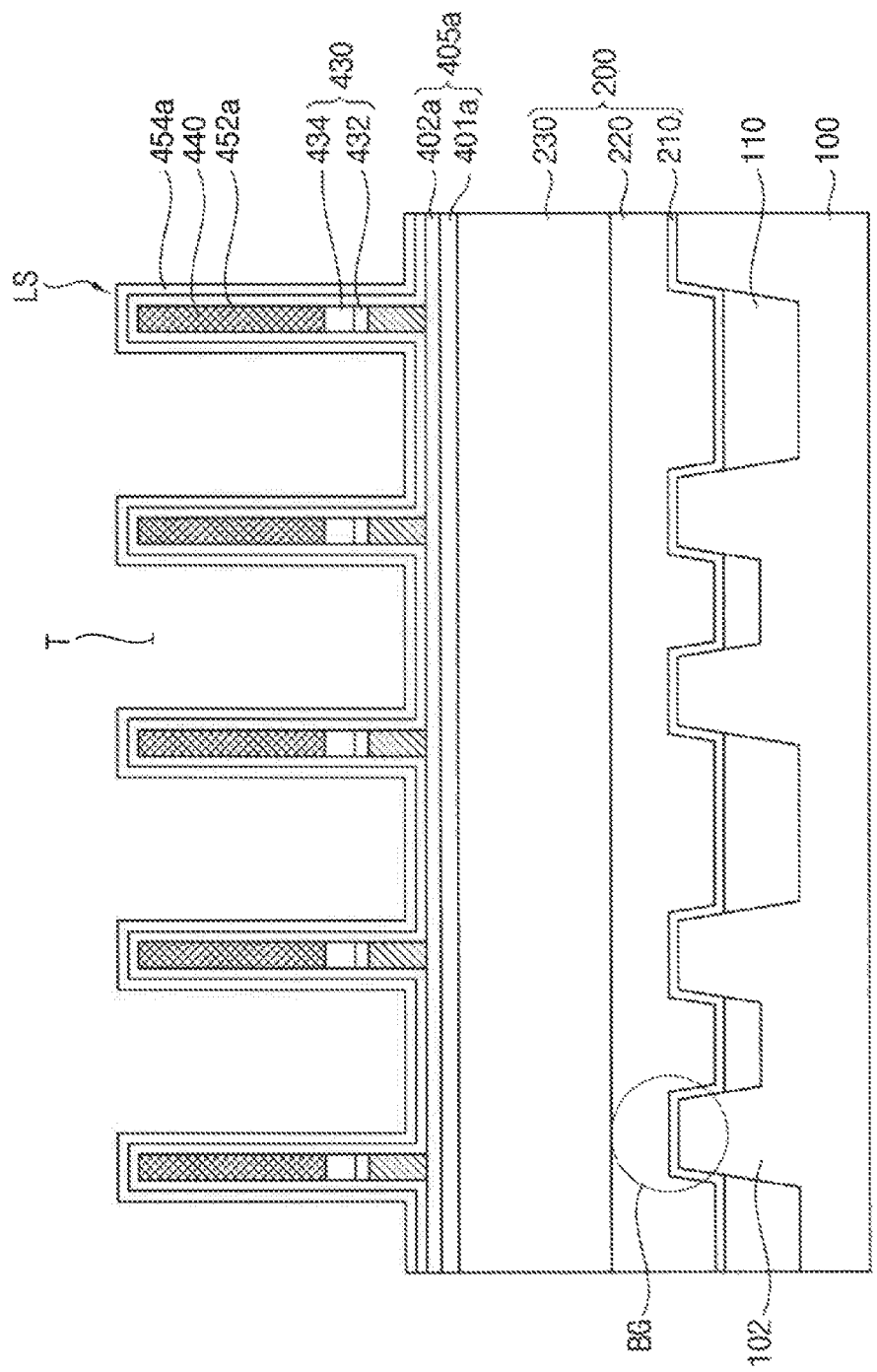

Referring to FIGS. 1, 9A and 9B, an inner spacer layer 454*a* may be formed on the liner spacer layer 452*a* along the surface profile of the line structure LS. For example, nitrides may be deposited on the liner spacer layer 452*a* to a predetermined thickness by a chemical vapor deposition process.

Thus, the gap space between the neighboring line structures LS defined by the inner spacer layer 454*a* may be formed into the bit line trench T. In such a case, the preliminary insulation pattern 405*a* may be covered by the liner spacer layer 452*a* and the inner spacer layer 454*a*.

Figure 10A:
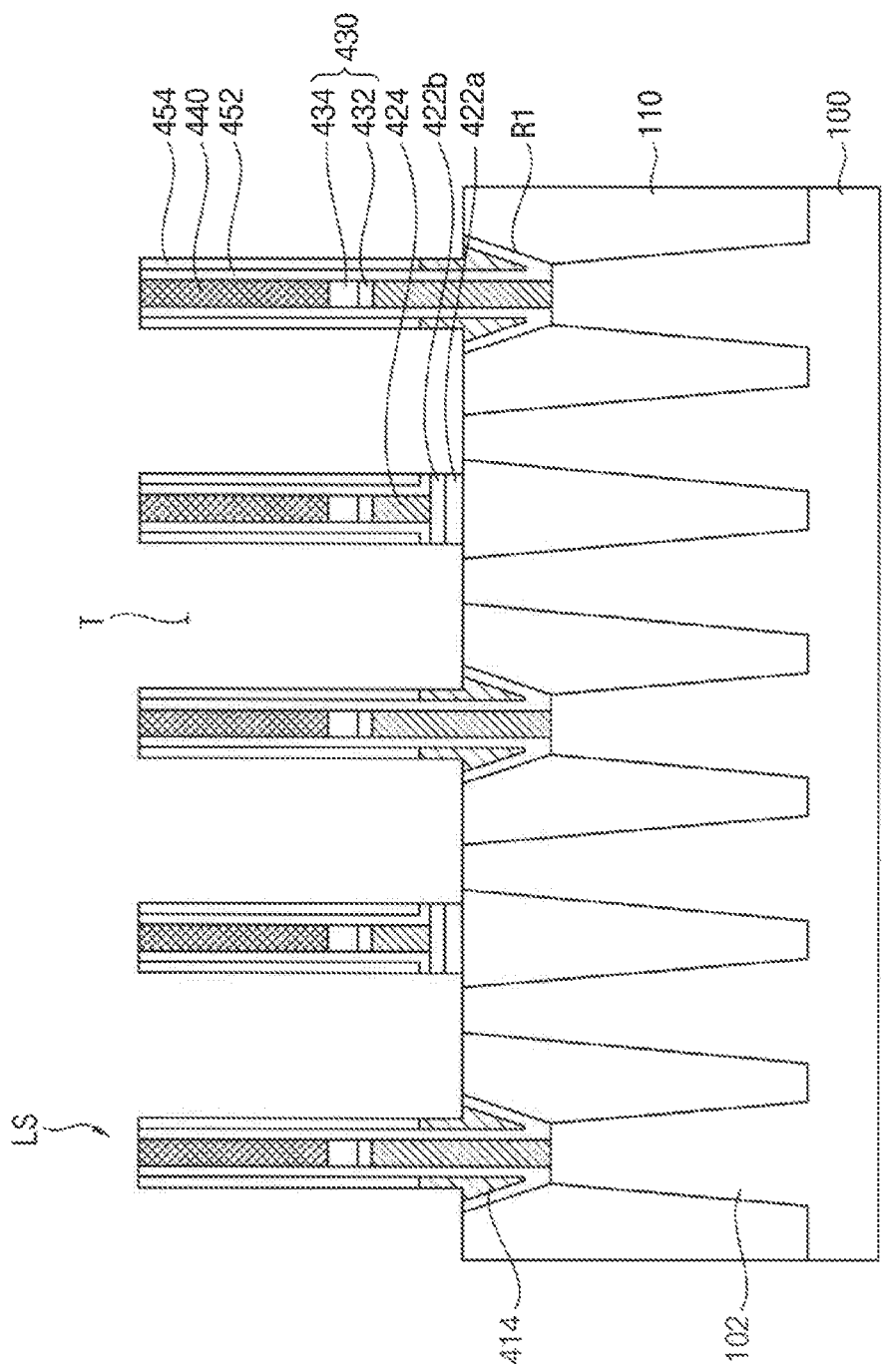
Figure 10B:
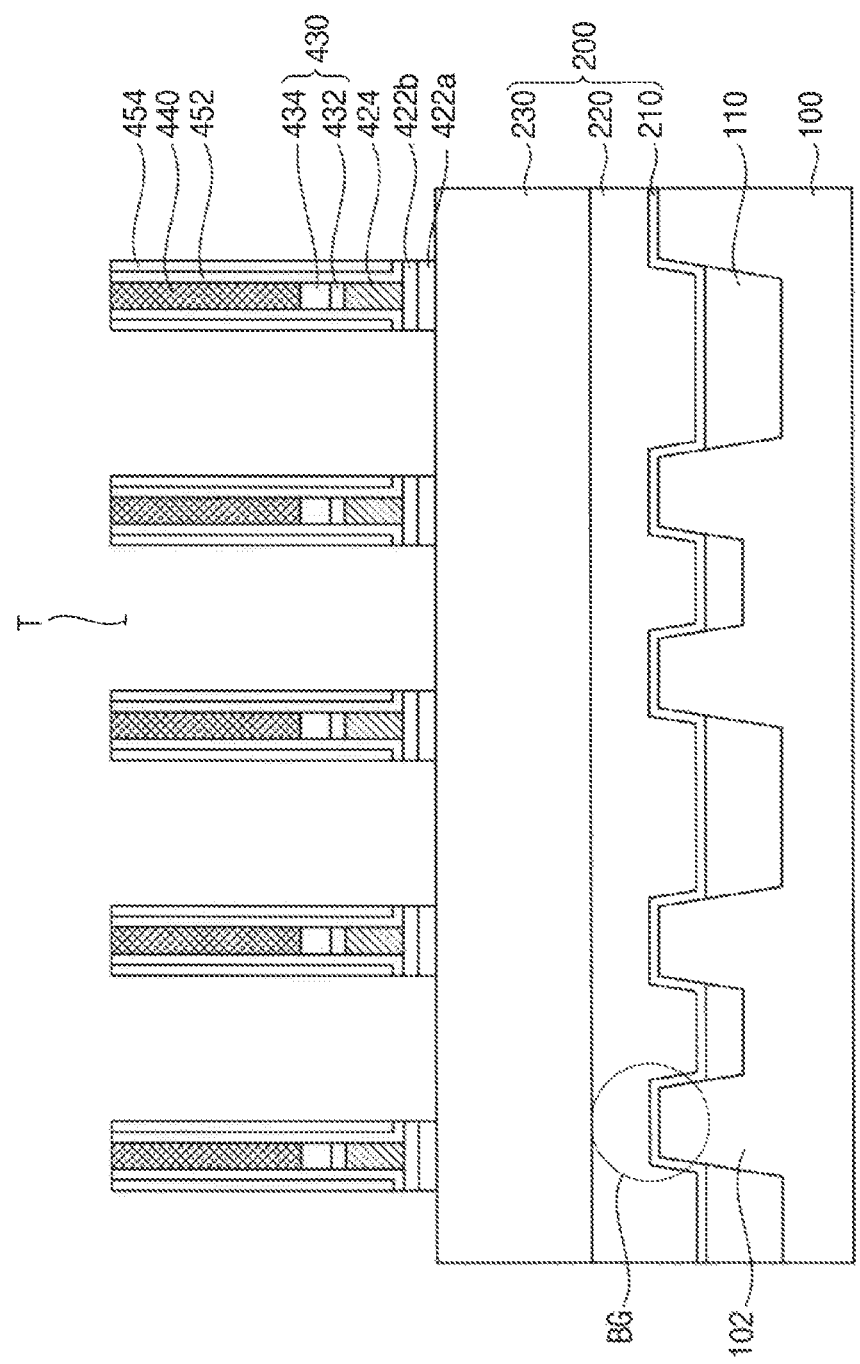

Referring to FIGS. 1, 10A and 10B, the inner spacer layer 454*a* may be partially removed by an anisotropic etching process in such a way that the inner spacer 454*a* on the side surface and top surface of the line structure LS may remain and the inner spacer 454*a* on the preliminary insulation pattern 405*a* may be removed, thereby forming the inner spacer 454 on the side and top surfaces of the line structure LS. Particularly, the preliminary insulation pattern 405*a*, the liner spacer layer 452*a* and the preliminary contact spacer 414*a* underlying the inner spacer layer 454*a* may also be partially removed from the substrate 100 by the same anisotropic process, so that the device isolation layer 110, the second junction 320 and the gate capping line 230 may be exposed through the bit line trench T. The preliminary insulation pattern 405*a* may be formed into the insulation pattern 422 and the preliminary contact spacer 414*a* may be formed into the contact spacer 414 by the anisotropic etching process. The insulation pattern 422 may include the base oxide pattern 422*a* and the etch stop pattern 422*b*.

The inner spacer layer 454*a* and the preliminary etch stop pattern 402*a* may have the same nitride and the preliminary base oxide pattern 401*a* may have an oxide, the preliminary insulation pattern 405 may be removed only by changing the etching conditions of the anisotropic etching process. Accordingly, the inner spacer 454 and the insulation pattern 422 may be formed in such a way that the side surface of the inner spacer 454 may be substantially coplanar with the side surface of the insulation pattern 422.

Particularly, the preliminary insulation pattern 405*a* may be removed from the substrate 100 along a whole bottom surface of the bit line trench T, thus the second junction 320 may also be fully exposed through a whole bottom of the bit line trench T. Therefore, the not-open defect may be sufficiently prevented because the second junction 320 may be exposed through the bit line trench T, not through the contact hole. In the related art process for forming a buried contact, the second junction is exposed by an individual contact hole, so when the contact hole is not accurately aligned with the second junction, the second junction is partially exposed or not exposed through the contact hole. However, according to the present inventive concept, the second junction 320 may be exposed through the bit line trench T, and thus the partial exposure or not exposure of the second junction 320 may be sufficiently prevented.

Figure 11A:
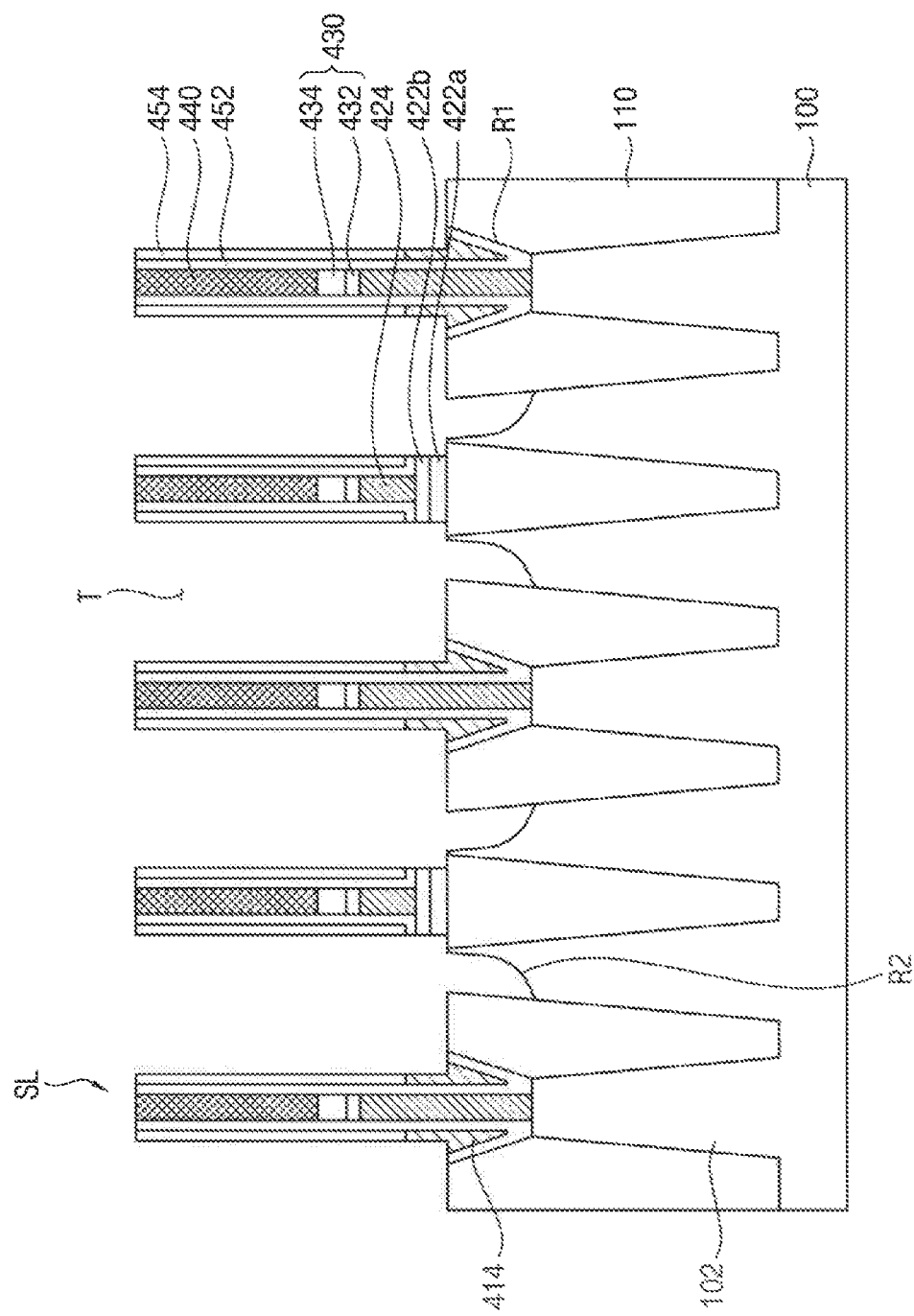
Figure 11B:
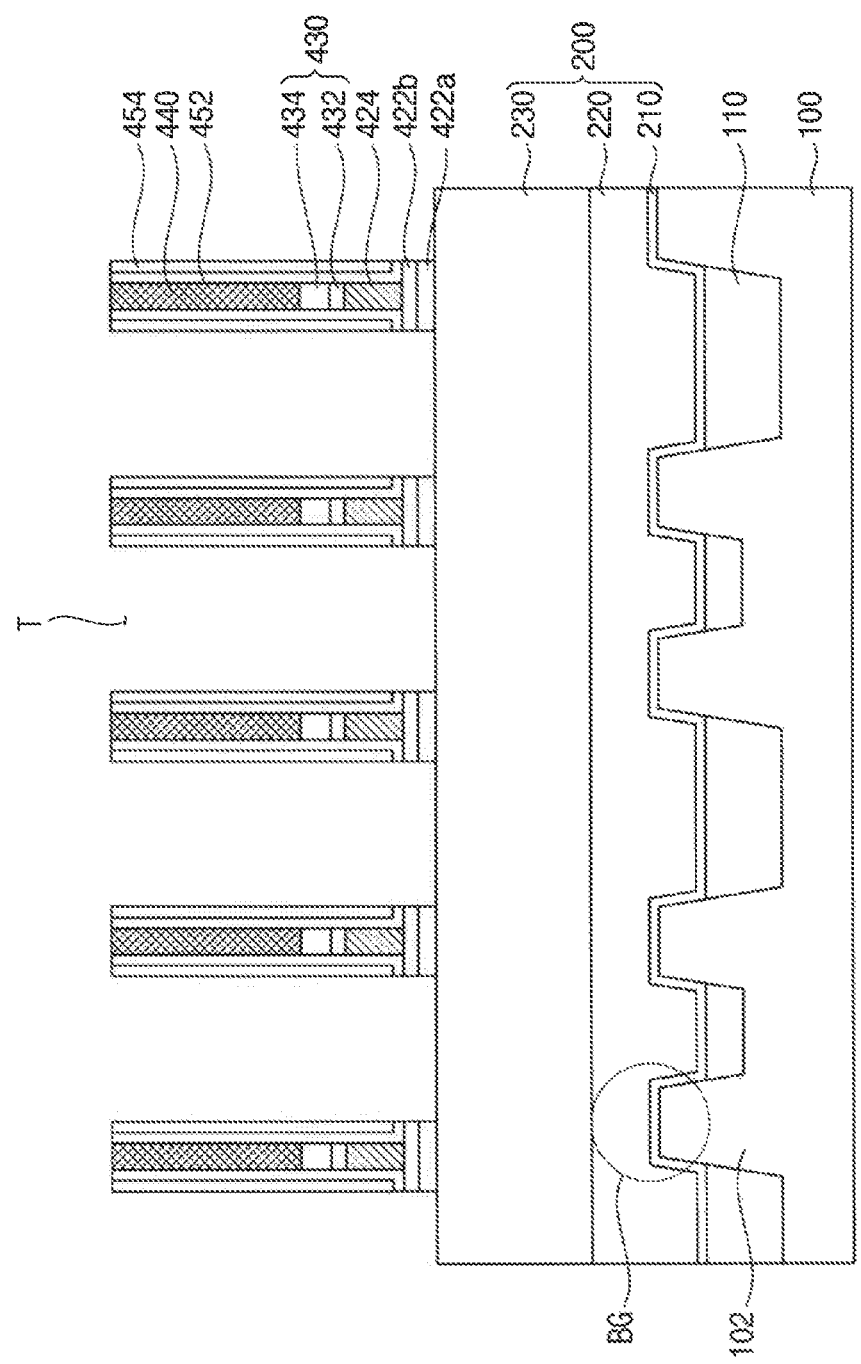

Referring to FIGS. 1, 11A and 11B, the second junction 320 may be partially removed from the substrate 100, thereby forming the second recess R2.

For example, an isotropic etching process may be conducted to the substrate 100 in such a way that only single crystalline silicon of the second junction 320 may be etched off from an upper portion of the second junction 320. In the present example embodiment, isotropic plasma etching (IPE) process may be conducted may be conducted to the substrate 100, so that the second junction 320 may be partially removed from the substrates 100 without any damages to the device isolation layer 110 and the gate capping line 230.

Side and bottom surfaces of the second recess R2 may function as a contact area between the second junction 320 and the buried semiconductor layer 322 that may constitute the storage contact structure SC together with the buried contact 500. Thus, the contact area between the second junction 320 and the storage contact structure SC may be enlarged as compared with the related art storage contact structure in which the buried contact may make contact with only an exposed surface of the second junction through the contact hole. The large contact area between the second junction and the storage contact structure may reduce the contact resistance of the storage contact structure SC. Accordingly, the size of the second recess R2 may be varied according to the requirements of the contact resistance of the storage contact structure SC.

Figure 12A:
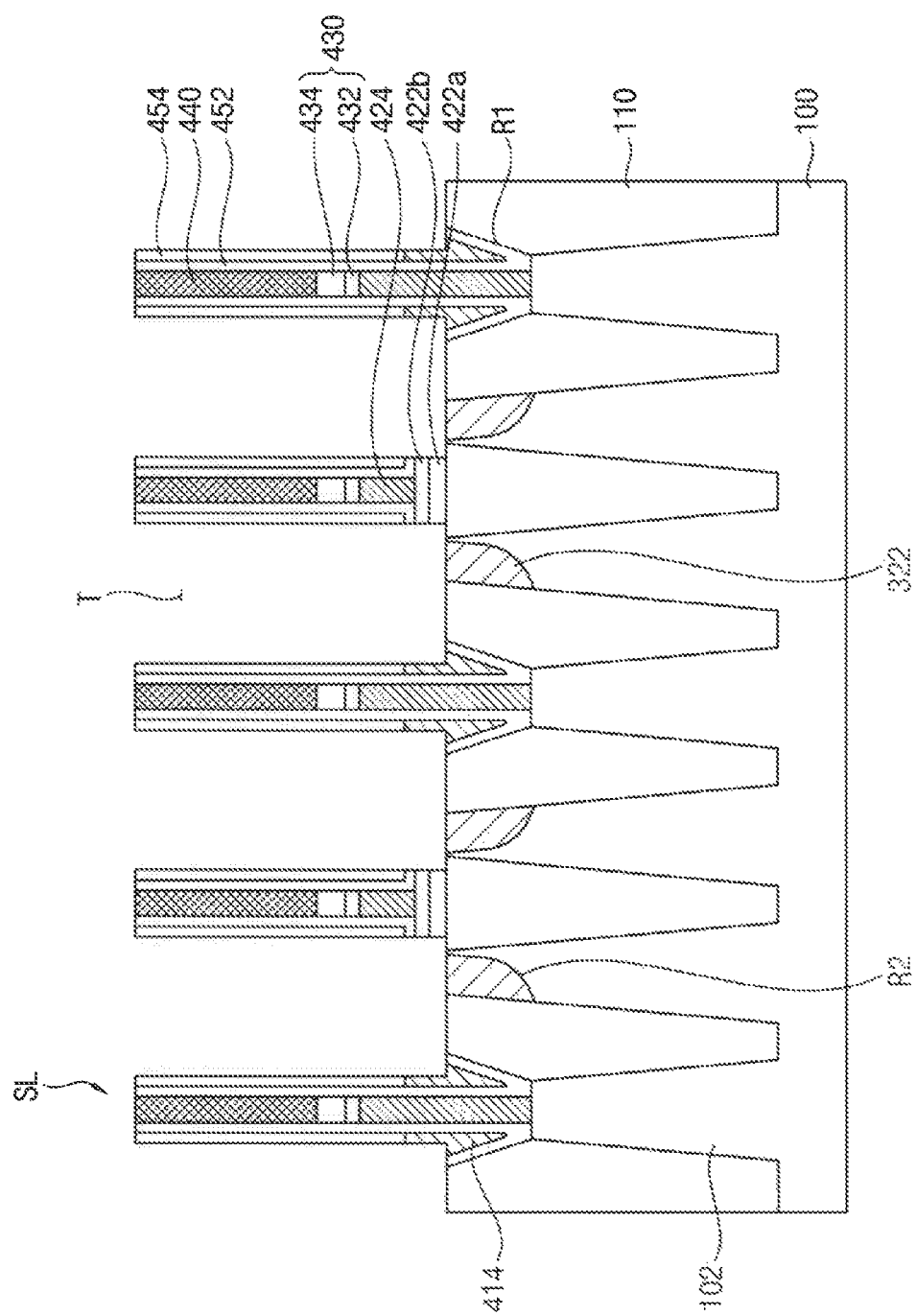
Figure 12B:
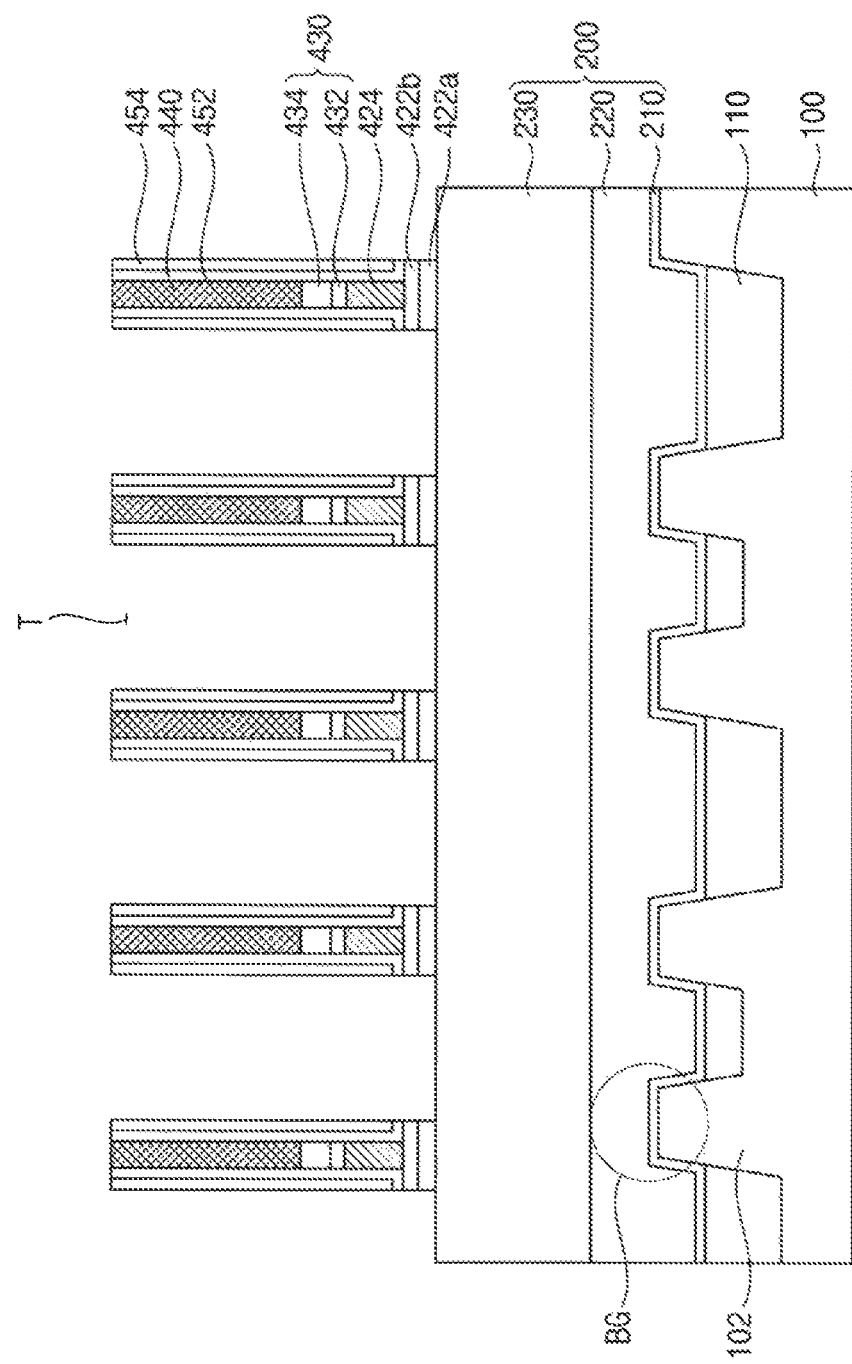

Referring to FIGS. 1, 12A and 12B, the second recess R2 may be filled up with semiconductor materials, thereby forming the buried semiconductor layer 322 in the second recess R2.

For example, a selective epitaxial growth (SEG) process may be conducted in the second recess R2 using a single crystalline silicon of the second junction 320 as a seed layer, thereby forming a SEG layer in the second recess R2. In the present example embodiment, since the buried contact 500 may comprise polysilicon, the dopants may be doped into the SEG layer so as to change the composition of the SEG layer into a polysilicon layer, thereby forming the buried semiconductor layer 322 comprising polysilicon in the second recess R2. However, the buried semiconductor layer 322 may have various compositions as long as the contact resistance between the buried semiconductor layer 322 and the buried contact 500 may be minimized.

Figure 13A:
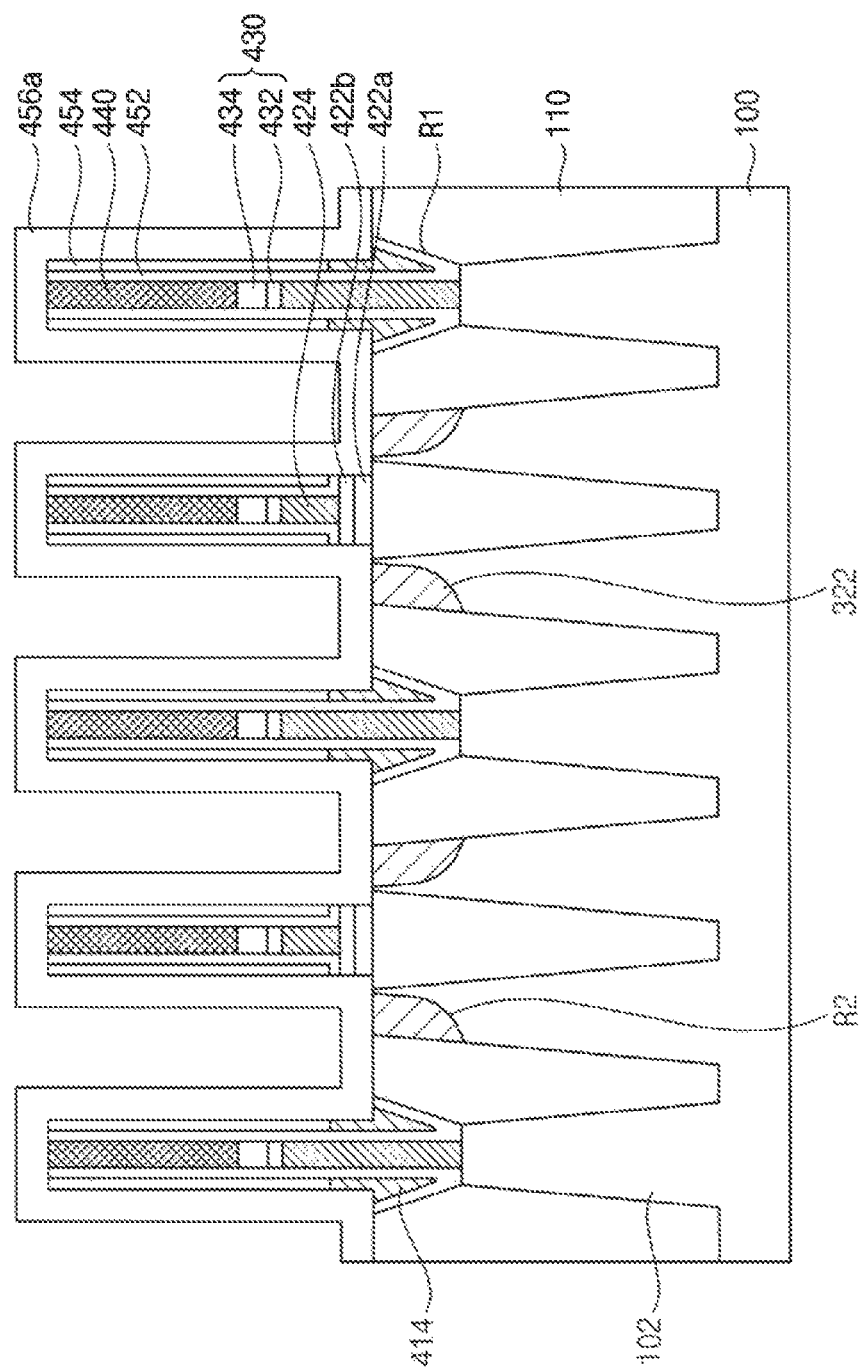
Figure 13B:
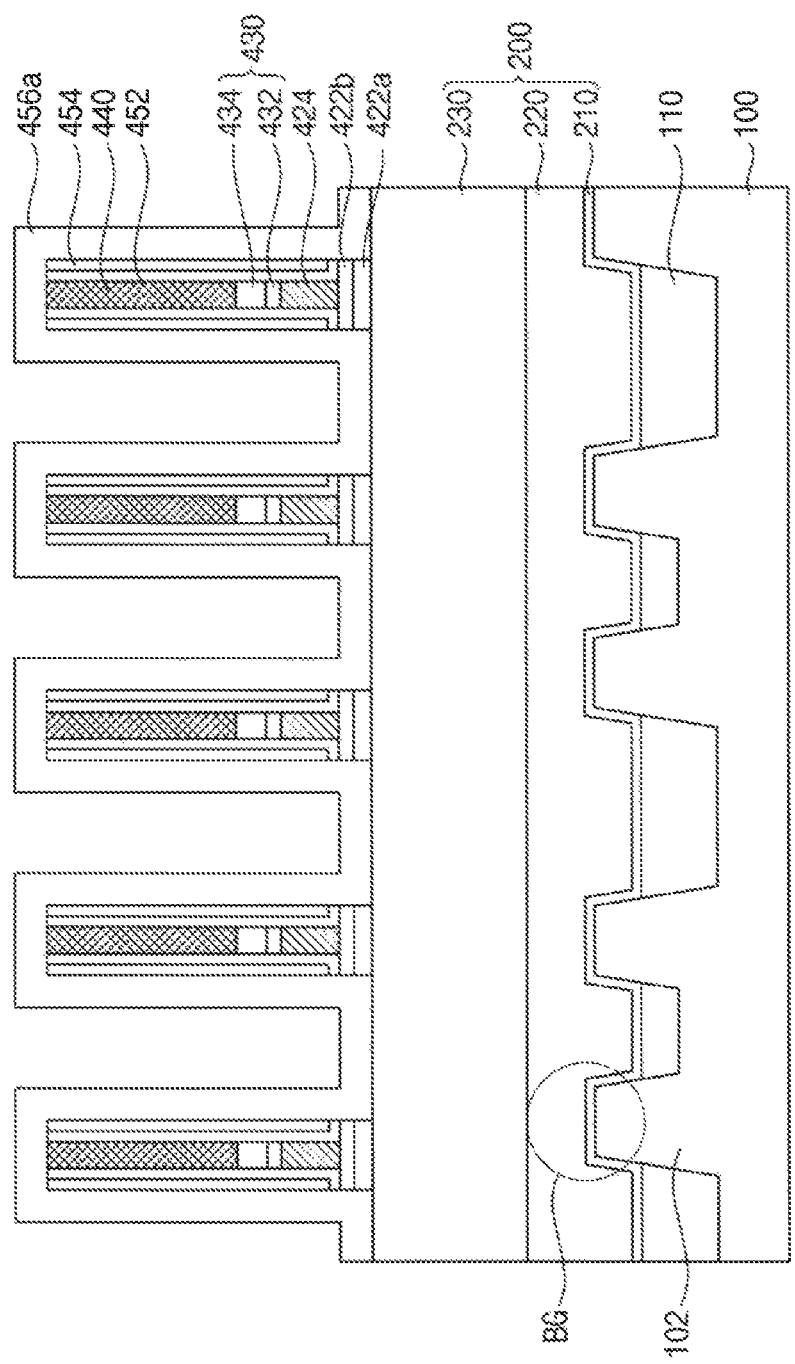

Referring to FIGS. 1, 13A and 13B, the outer spacer layer 456a may be formed on the substrate 100 along a surface profile of the line structure LS covered by the inner spacer 454 and supported by the insulation pattern 422, so that the side surfaces of the inner spacer 454 and the insulation pattern 422 may be covered with the outer spacer 456a and the buried semiconductor layer 322, the second junction 320, the device isolation layer and the gate capping line 230 may be covered with the outer spacer layer 456a.

For example, nitride materials may be deposited on the bottom and side surfaces of the bit line trench T by a deposition process such as a CVD process and an atomic layer deposition (ALD) process to a sufficient thickness, thereby forming the outer spacer layer 456a.

The side surfaces of the inner spacer 454 and the insulation pattern 422 may be covered with the outer spacer layer 456a and the side surfaces of the inner spacer 454a and the outer spacer 414a may also be covered with the outer spacer layer 456a.

Figure 14A:
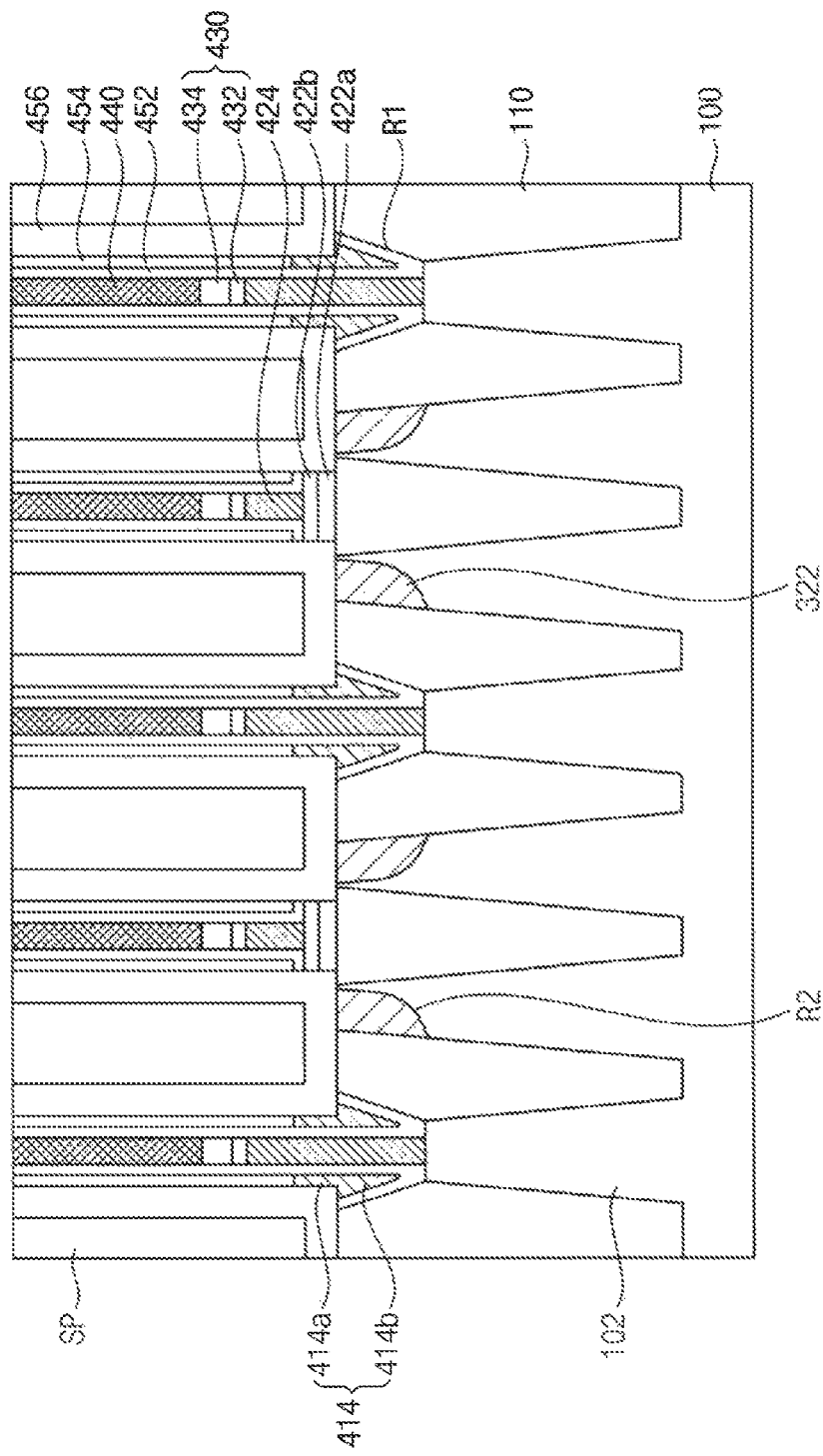
Figure 14B:
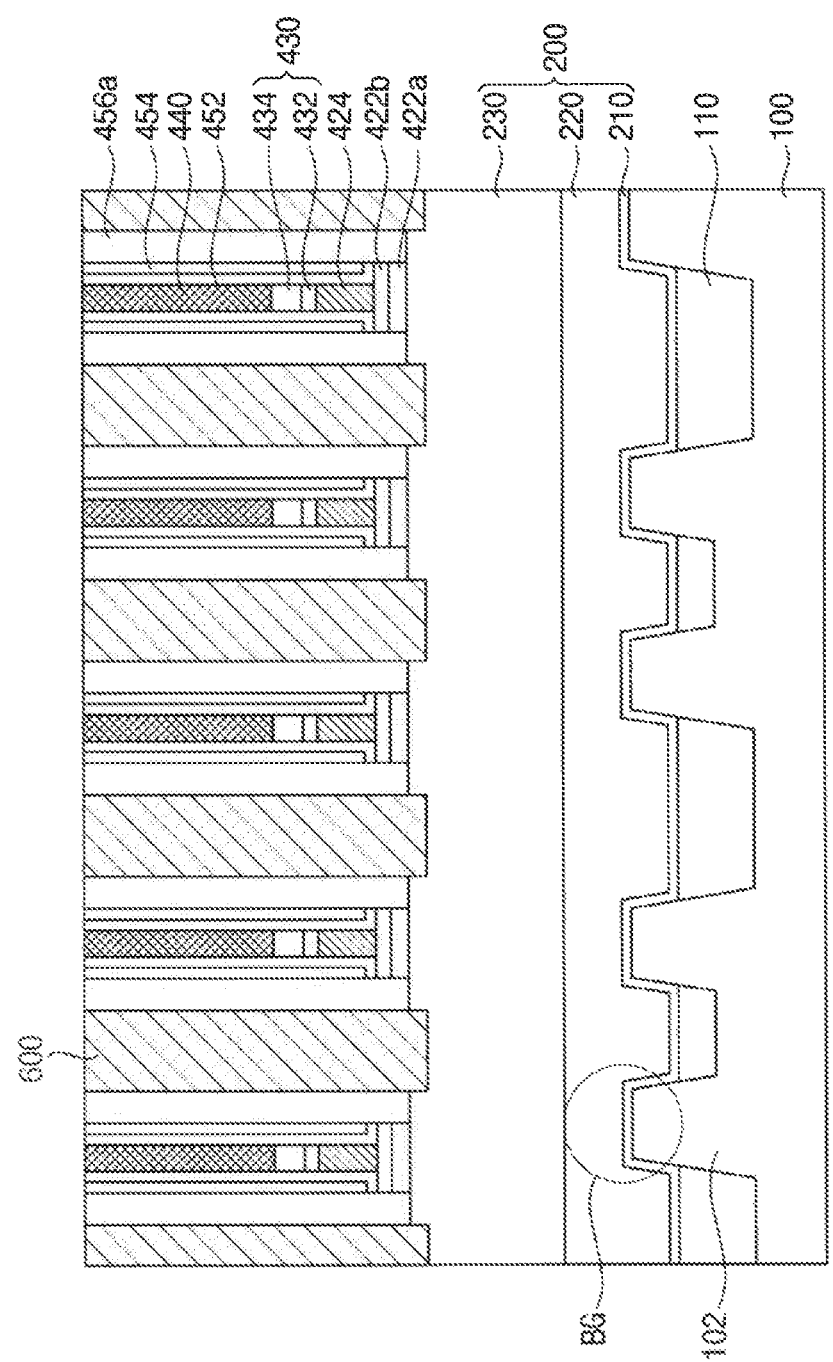

Referring to FIGS. 1, 14A and 14B, a fence pattern 600 may be formed on the word line WL.

A sacrificial layer (not shown) may be formed on a whole surface of the substrate 100 to a sufficient thickness to fill up the bit line trench T and then may be planarized until an upper surface of the bit line capping pattern 440 may be exposed. Thus, the sacrificial layer may remain only in the bit line trench T as a sacrificial pattern SP that may be node-separated by the bit line trench T. Particularly, the outer spacer layer 456a may also be node-separated by the bit line trench T in the planarization process, thereby forming the outer spacer 456 covering the side surfaces of the inner spacer 454 and the insulation pattern 422 in the bit line trench T. Accordingly, the bit line trench T may be filled up with the outer spacer 456 and the sacrificial pattern SP.

Then, a mask pattern (not shown) may be formed on the whole surface of the sacrificial pattern SP, the outer spacer 456 and the bit line capping pattern 440 in such a configuration that the sacrificial pattern SP over the word line WL may be exposed. Then, an etching process may be conducted to the sacrificial pattern SP using the mask pattern as an etching mask, so the sacrificial pattern SP on the word line WL between the neighboring line structures LS may be removed from the substrate 100 and the outer spacer 456 may be exposed to surroundings. Thereafter, the bottom of the outer spacer 456 may be removed from by an anisotropic etching process, thereby forming a fence hole FH through which the gate capping line 230 may be exposed and defined by the outer spacer 456 in the first direction I. In such a case, an upper surface of the gate capping line 230 may be over etched in the anisotropic etching process. Accordingly, the fence hole FH may be defined by the sacrifice pattern SP in the second direction II and by the outer spacer 456 in the first direction I.

An insulation layer (not shown) may be formed on the whole surface of the sacrificial pattern SP, the outer spacer 456 and the bit line capping pattern 440 to a sufficient thickness to fill up the fence hole FH and may be planarized until an upper surface of the bit line capping pattern 440 may be exposed, so that the insulation layer may remain only in the fence hole FH, thereby forming the fence pattern 600 in the fence hole FH. For example, the fence pattern 600 may comprise silicon nitride or silicon oxynitride.

Figure 15A:
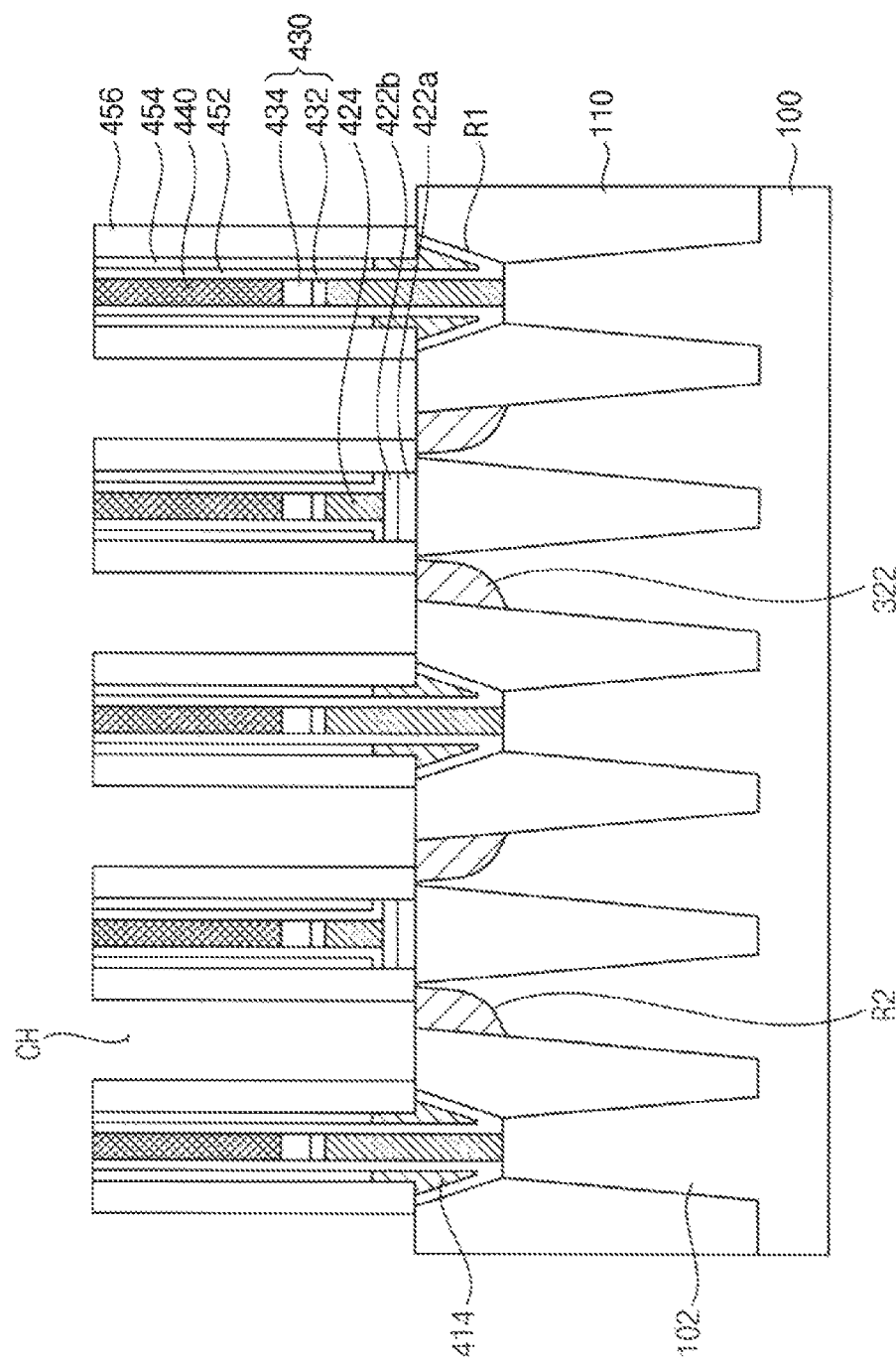
Figure 15B:
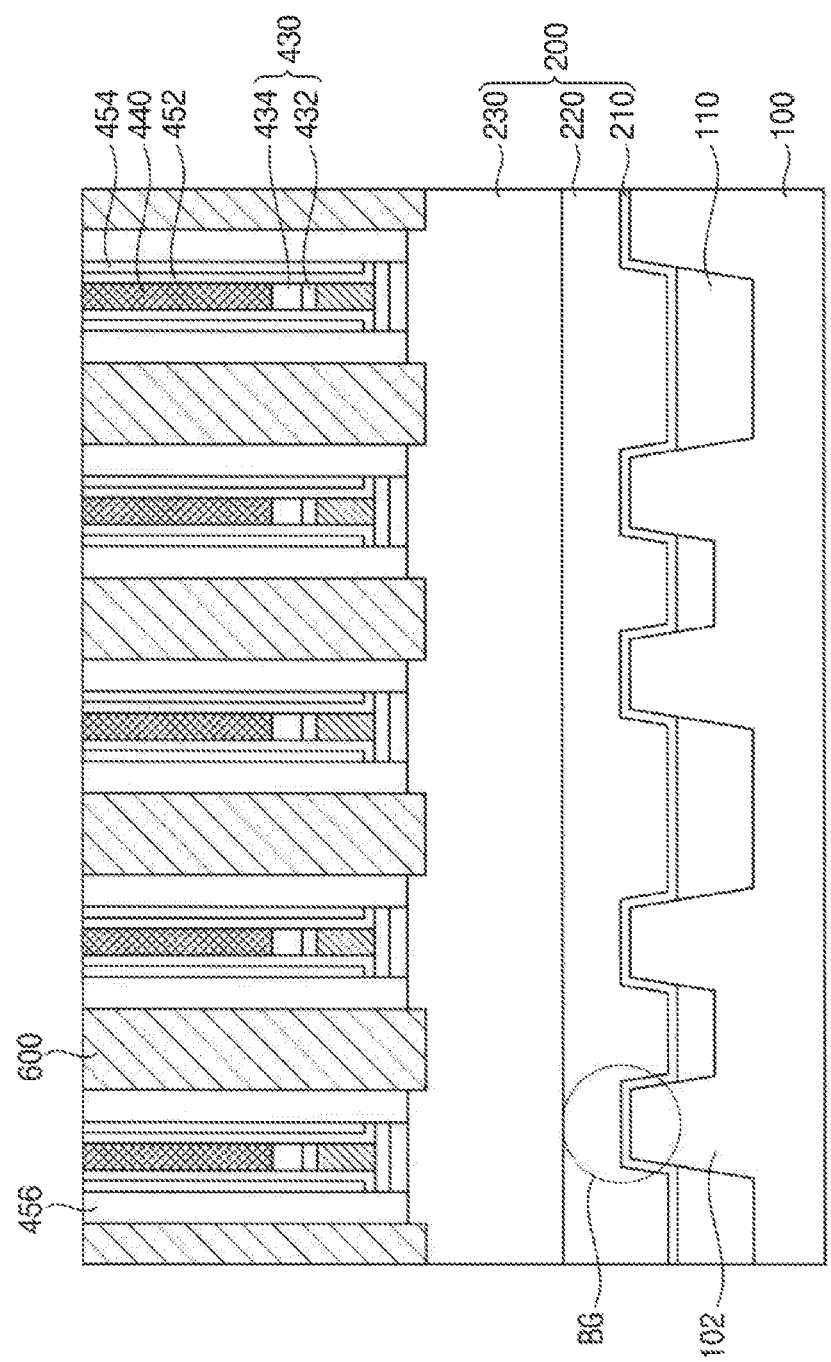

Referring to FIGS. 1, 15A and 15B, the sacrificial pattern SP over the second junction 320 may be removed from the substrate 100, so the outer spacer 456 over the second junction 320 may be exposed. Then, an anisotropic etching process may be conducted to the bottom of the outer spacer 456, thereby forming a contact hole CH through which the second junction and the buried semiconductor layer 322 may be exposed.

For example, the sacrificial pattern SP may be removed from the substrate 100 by a self-aligned etching process using the fence pattern 600 and the outer spacer 456 as an etching mask. Thus, the contact hole CH may be defined by the outer spacer 456 in the first direction I and by the fence pattern 600 in the second direction II. As described above, the size of the contact hole CH may increase due to the reduction of the insulation pattern 422 in forming the inner spacer 454.

Particularly, the contact hole CH may be formed by the self-aligned etching process to the sacrificial pattern SP and the anisotropic etching process to the bottom of the outer spacer 456, so that the second junction 320 and the buried semiconductor layer 322 may be sufficiently exposed through the contact hole CH and thus the not-open defect of the contact hole CH may be sufficiently prevented.

In the related art process, the contact hole has a relatively high aspect ratio and a small size, so the second junction is not sufficiently exposed through the contact hole. The second junction is partially exposed or is not exposed through the contact hole. However, the contact hole CH of the present inventive concept has a relative large size and the second junction 320 and the buried semiconductor layer 322 may be exposed only by the removal of the bottom of the outer spacer 456. Thus, the not-open defect of the contact hole CH may be sufficiently prevented.

Figure 16B:
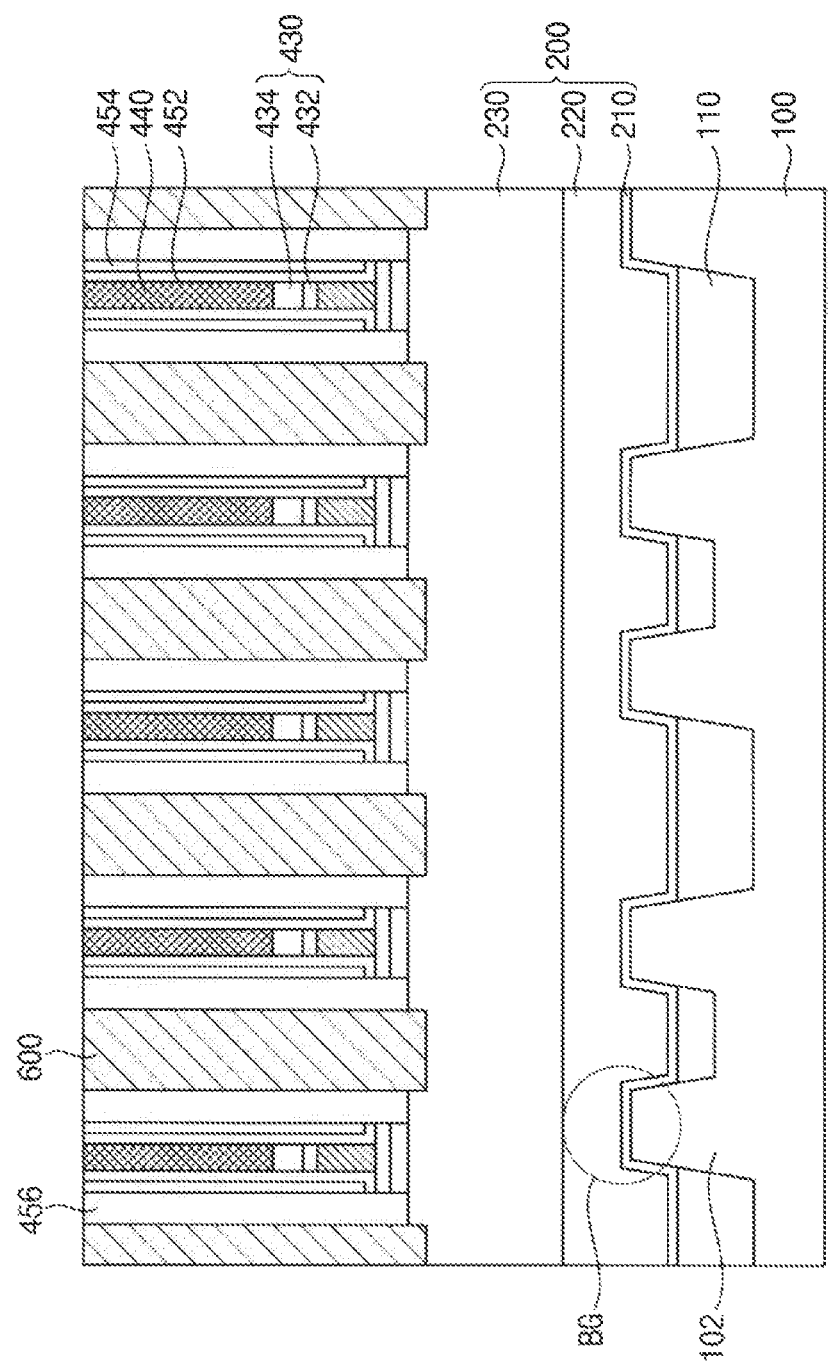

Referring to FIGS. 1, 16A and 16B, the buried contact 500 may be formed in the contact hole CH, so the second junction 320 and the buried semiconductor layer 322 may be connected to the buried contact 500.

For example, a conductive layer (not shown) may be formed on the substrate 100 to a sufficient thickness to fill up the contact hole CH and then may be planarized until an upper surface of the bit line capping pattern 440 may be exposed, so the conductive layer may remain only in the contact hole CH, thereby forming the buried contact 500 in the contact hole CH.

Particularly, the buried contact 500 may comprise the same material as the buried semiconductor layer 322, so the contact resistance between the buried contact 500 and the buried semiconductor layer 322 may be minimized in the contact hole CH. The buried contact 500 may constitute the storage contact structure SC together with the buried semiconductor layer 322.

In the present example embodiment, the conductive materials for the buried contact 500 may include doped polysilicon, so that the storage contact structure SC may comprise polysilicon.

The second junction 320 and the storage contact structure SC may make contact with each other along the side and bottom surfaces of the second recess R2, so that the contact area between the second junction 320 and the storage contact structure SC may be enlarged as compared with the related art storage contact structure. In the related art storage contact structure, the buried contact makes contact with an upper surface of the second junction in the contact hole. Thus, the buried contact 500 is contact only with the exposed surface of the second junction in the contact hole. Accordingly, the contact resistance of the storage contact structure SC may be significantly reduced in the semiconductor device 1000.

Although not shown in figures, a contact pad (not shown) may be further formed on the buried contact 500. An upper portion of the buried contact 500 may be removed and an upper portion of the contact hole CH may be opened. Then, a conductive pattern may be formed as the contact pad in such a way that the contact pad may fill up the upper portion of the contact hole CH and may be connected to the buried contact 500 and further may cover the bit line capping pattern 440.

Thereafter, an upper insulation interlayer (not shown) may be formed on the substrate 100 having the buried contact 500 and the charge storage 700 may be formed on the insulation interlayer and may be connected to the buried contact 500 through the upper insulation interlayer.

According to the example embodiments of the present inventive concept, the insulation pattern may be reduced in such a configuration that the side surface of the inner spacer may be substantially coplanar with the side surface of the insulation pattern and the side surfaces of the inner spacer and the insulation pattern may be covered with the outer spacer. The contact hole may be defined by the outer spacer and the fence pattern. Therefore, the contact hole may be enlarged as much as the reduction of the insulation pattern and thus the void or seam defects may be reduced in the buried contact.

In addition, the buried semiconductor layer may be provided in some of the second junction that may constitute the storage contact structure together with the buried contact. Thus, the contact area between the second junction and the storage contact structure may be enlarged due to the boundary surface of the buried semiconductor layer, thereby reducing the contact resistance of the storage contact structure.

Further, the buried semiconductor layer may be formed by a selective etching process to the single crystalline silicon of the second junction, so the buried semiconductor layer may be formed without any damages to the device isolation layer around the second junction. Therefore, the current leakage such as GIDL may be sufficiently prevented in spite of the buried semiconductor layer. That is, the contact resistance of the second junction and the storage contact structure may be reduced without the current leakage, thereby significantly improve the electric characteristics of the semiconductor device.

Still further, since the second junction may be exposed through the self-aligned etching process to the sacrificial pattern and the anisotropic etching process to the bottom of the outer spacer, the not-open defect of the contact hole may be sufficiently prevented in the manufacturing process for the semiconductor devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present disclosure as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:
   a substrate having a plurality of active regions defined by a device isolation layer;
   a plurality of word lines extending in a first direction across the plurality of active regions and arranged in a second direction at same intervals;
   a doped junction having impurities and arranged at the plurality of active regions, the doped junction including a plurality of first junctions and a plurality of second junctions, each of the plurality of first junctions arranged at a central portion of one of the plurality of active regions and each of the plurality of second junctions arranged at an end portion of another one of the plurality of active regions, a buried semiconductor layer being included in each of the plurality of second junctions;
   a plurality of bit line structures extending in the second direction and arranged in the first direction at same intervals such that each of the plurality of bit line structures makes contact with a respective one of the plurality of first junctions; and a plurality of buried contacts arranged in a matrix shape in the first direction and in the second direction such that each of the plurality of buried contacts makes contact with a respective one of the plurality of second junctions and the buried semiconductor layer included in the respective one of the plurality of second junctions between neighboring bit line structures and simultaneously makes contact with a charge storage for storing data.

2. The semiconductor device of claim 1, wherein a first upper surface of each of the plurality of first junctions is lower than a second upper surface of the device isolation layer and a third upper surface of each of the plurality of second junctions is substantially coplanar with the second upper surface of the device isolation layer.

3. The semiconductor device of claim 2, wherein a fourth upper surface of the buried semiconductor layer is substantially coplanar with the second upper surface of the device isolation layer and a lower surface of the buried semiconductor layer is equal to or higher than the first upper surface of each of the plurality of first junctions.

4. The semiconductor device of claim 2, wherein the buried semiconductor layer includes an epitaxial polysilicon layer by a selective epitaxial growth (SEG) process using silicon of the plurality of active regions as a seed.

5. The semiconductor device of claim 2, wherein each of the plurality of bit line structures includes:
a bit line contact extending upwards from the respective one of the plurality of first junctions;
a buffer line extending in the second direction between neighboring bit line contacts in the second direction;
a conductive bit line making simultaneous contact with the bit line contact and the buffer line in the second direction;
a bit line capping pattern arranged on the bit line as a line shape extending in the second direction; and
a bit line spacer covering side surfaces of the bit line contact, the bit line, the buffer line and the bit line capping pattern and extending in the second direction.

6. The semiconductor device of claim 5, wherein the bit line contact includes a direct contact comprising a conductive material and extending from the respective one of the plurality of first junctions to the bit line and a contact spacer enclosing the direct contact, and the buffer line includes an insulation pattern on the substrate and a buffer pattern arranged on the insulation pattern and making contact with the bit line.

7. The semiconductor device of claim 6, wherein the bit line spacer includes:
a liner spacer covering first side surfaces of the direct contact, second side surfaces of the bit line and third side surfaces of the buffer pattern, and covering an upper surface of the insulation pattern;
an inner spacer covering the liner spacer wherein a spacer side surface of the inner spacer is substantially coplanar with a insulation side surface of the insulation pattern; and
an outer spacer covering the spacer side surface and the insulation side surface, and making contact with a neighboring second junction, a buried semiconductor layer of the neighboring second junction and the device isolation layer.

8. The semiconductor device claim 7, wherein a fourth upper surface of the contact spacer is a same level as a lower surface of the inner spacer.

9. The semiconductor device of claim 8, wherein the contact spacer includes a lower spacer arranged under the substrate and enclosing a lower portion of the direct contact and an upper spacer protruding from the lower spacer higher than the substrate and enclosing a middle portion of the direct contact, wherein the upper spacer has a same spacer thickness as the inner spacer and the lower spacer has a lower spacer thickness greater than an upper spacer thickness of the upper spacer.

10. A semiconductor device comprising:
a substrate having a plurality of active regions defined by a device isolation layer, each active region having a recessed first junction, and a second junction spaced apart from the recessed first junction and having a buried semiconductor layer;
a plurality of bit line structures extending in a direction and making contact with a plurality of recessed first junctions in the direction; and
a plurality of buried contacts making contact with the second junction and the buried semiconductor layer between neighboring bit line structures and simultaneously making contact with a charge storage for storing data.

11. The semiconductor device of claim 10, wherein the buried semiconductor layer includes an epitaxial polysilicon layer by a selective epitaxial growth (SEG) process using silicon of the plurality of active regions as a seed.

12. The semiconductor device of claim 10, wherein each of the plurality of bit line structures includes:
a bit line extending in the direction and comprising a conductive material;
a bit line contact interposed between the recessed first junction and the bit line, the bit line contact having a direct contact comprising a conductive material and extending from the recessed first junction to the bit line and a contact spacer enclosing the direct contact;
a buffer line extending in the direction between neighboring bit line contacts, the buffer line having an insulation pattern on the substrate and a buffer pattern arranged on the insulation pattern and having a first upper surface substantially coplanar with a second upper surface of the direct contact; and
a bit line spacer covering sides of the bit line contact, the bit line, the buffer line and extending in the direction.

13. The semiconductor device of claim 12, wherein the bit line spacer includes:
a liner spacer covering side surfaces of the direct contact, the bit line and the buffer pattern, and covering an upper surface of the insulation pattern;
an inner spacer covering the liner spacer wherein a spacer side surface of the inner spacer is substantially coplanar with an insulation side surface of the insulation pattern; and
an outer spacer covering the spacer side surface and the insulation side surface, and making contact with a neighboring second junction, a buried semiconductor layer of the neighboring second junction and the device isolation layer.

14. The semiconductor device of claim 13, wherein a contact spacer upper surface of the contact spacer is a same level as a lower surface of the inner spacer.

15. The semiconductor device of claim 14, wherein the contact spacer includes a lower spacer arranged under the substrate and enclosing a lower portion of the direct contact and an upper spacer protruding from the lower spacer higher than the substrate and enclosing a middle portion of the direct contact wherein the upper spacer has a same spacer thickness as the inner spacer and the lower spacer has a lower spacer thickness greater than the upper spacer, wherein side surfaces of the inner spacer and the upper spacer are covered with the outer spacer.

16. A semiconductor device comprising:
   a substrate having a plurality of active regions defined by a device isolation layer;
   a plurality of word lines extending in a first direction across the plurality of active regions and arranged in a second direction at same intervals, the second direction orthogonal to the first direction;
   a plurality of first junctions having impurities and arranged at a first portion of the plurality of active regions;
   a plurality of second junctions having impurities and arranged at a second portion of the plurality of active regions, each second junction including a buried semiconductor layer formed therein, the buried semiconductor layer extending in a third direction that is orthogonal to both the first direction and the second direction;
   a plurality of bit line structures extending in the second direction and arranged in the first direction at same intervals, each of the plurality of bit line structures making contact with a respective one of the plurality of first junctions; and
   a plurality of buried contacts arranged in a matrix shape in the first direction and in the second direction, each of the plurality of buried contacts making contact with a respective one of the plurality of second junctions and the buried semiconductor layer included in the respective one of the plurality of second junctions and simultaneously making contact with a charge storage for storing data.

17. The semiconductor device of claim 16, wherein a first upper surface of each of the plurality of first junctions is lower than a second upper surface of the device isolation layer and a third upper surface of each of the plurality of second junctions is substantially coplanar with the second upper surface of the device isolation layer.

18. The semiconductor device of claim 17, wherein a fourth upper surface of the buried semiconductor layer is substantially coplanar with the second upper surface of the device isolation layer and a lower surface of the buried semiconductor layer is equal to or higher than the first upper surface of each of the plurality of first junctions.

19. The semiconductor device of claim 17, wherein the buried semiconductor layer includes an epitaxial polysilicon layer by a selective epitaxial growth (SEG) process using silicon of the plurality of active regions as a seed.

20. The semiconductor device of claim 17, wherein each of the plurality of bit line structures includes:
   a bit line contact extending in the third direction from the respective one of the plurality of first junctions;
   a buffer line extending in the second direction between neighboring bit line contacts in the second direction;
   a conductive bit line making simultaneous contact with the bit line contact and the buffer line in the second direction;
   a bit line capping pattern arranged on the bit line as a line shape extending in the second direction; and
   a bit line spacer extending in the second direction and covering surfaces of the bit line contact, the bit line, the buffer line and the bit line capping pattern.

* * * * *